United States Patent
Bruwer et al.

(10) Patent No.: US 10,527,457 B2
(45) Date of Patent: Jan. 7, 2020

(54) INDUCTANCE SENSING

(71) Applicant: AZOTEQ (PTY) LTD, Paarl (ZA)

(72) Inventors: Frederick Johannes Bruwer, Paarl (ZA); Douw Gerbrandt Van Der Merwe, Paarl (ZA)

(73) Assignee: AZOTEQ (PTY) LTD, Paarl (ZA)

(*) Notice: Subject to any disclaimer, the term of this patent is extended or adjusted under 35 U.S.C. 154(b) by 225 days.

(21) Appl. No.: 15/554,181

(22) PCT Filed: Feb. 26, 2016

(86) PCT No.: PCT/ZA2016/050008
§ 371 (c)(1),
(2) Date: Aug. 28, 2017

(87) PCT Pub. No.: WO2016/138546
PCT Pub. Date: Sep. 1, 2016

(65) Prior Publication Data
US 2018/0128650 A1  May 10, 2018

(30) Foreign Application Priority Data

Feb. 27, 2015 (ZA) .................................. 201501335
Mar. 18, 2015 (ZA) .................................. 201501840
Jul. 27, 2015 (ZA) .................................. 201505379
Aug. 14, 2015 (ZA) .................................. 201505840
Oct. 8, 2015 (ZA) .................................. 201507458

(51) Int. Cl.
*G01D 5/20* (2006.01)
*H03H 2/00* (2006.01)

(52) U.S. Cl.
CPC ........... *G01D 5/2006* (2013.01); *H03H 2/005* (2013.01)

(58) Field of Classification Search
CPC ..... G01D 5/20; G01D 5/2006; G01R 27/2611
See application file for complete search history.

(56) References Cited

U.S. PATENT DOCUMENTS

| 3,129,418 A | 4/1964 | De La Tour |
| 3,192,471 A | 6/1965 | Kuhrt et al. |
| 3,365,594 A | 1/1968 | Davidson, Jr. |

(Continued)

FOREIGN PATENT DOCUMENTS

| EP | 0 365 758 B1 | 10/1992 |
| EP | 0 452 803 B1 | 10/1994 |

(Continued)

OTHER PUBLICATIONS

"Inductive and Magnetic Sensors", Rice University, Chapter 12, pp. 1-7, URL: https://www.ece.rice.edu/~jdw/435/book/ch12.pdf.

(Continued)

*Primary Examiner* — Walter L Lindsay, Jr.
*Assistant Examiner* — Milton Gonzalez
(74) *Attorney, Agent, or Firm* — Mattingly & Malur, PC

(57) ABSTRACT

Inductance values are measured though the use of a charge transfer based measurement system. During a first phase, a target inductor is connected to an energy source to allow current through an inductor to increase. In a second phase, the inductor is disconnected from the energy source, to allow the current to decrease, and to facilitate transfer of charge to a capacitor. The phases may be repeated, and a count is kept of the number of repetitions.

20 Claims, 12 Drawing Sheets

(56) References Cited

U.S. PATENT DOCUMENTS

| | | |
|---|---|---|
| 3,530,317 A | 9/1970 | Lang |
| 3,683,371 A | 8/1972 | Holz |
| 3,740,746 A | 6/1973 | Dureau et al. |
| 3,757,068 A | 9/1973 | Musch et al. |
| 3,835,373 A | 9/1974 | Matula |
| 4,356,732 A | 11/1982 | Hachtel et al. |
| 4,369,405 A | 1/1983 | Sato et al. |
| 4,406,999 A | 9/1983 | Ward |
| 4,494,109 A | 1/1985 | Bernin |
| 4,507,638 A | 3/1985 | Brosh |
| 4,507,639 A | 3/1985 | Trenkler et al. |
| 4,529,967 A | 7/1985 | Gifft |
| 4,737,698 A | 4/1988 | McMullin et al. |
| 4,737,710 A | 4/1988 | Van Antwerp et al. |
| 4,777,436 A | 10/1988 | Fiori |
| 4,853,604 A | 8/1989 | McMullin et al. |
| 4,912,409 A | 3/1990 | Redlich et al. |
| 5,083,468 A | 1/1992 | Dobler et al. |
| 5,109,193 A | 4/1992 | Pike |
| 5,126,665 A | 6/1992 | Hachtel et al. |
| 5,200,698 A | 4/1993 | Thibaud |
| 5,541,510 A | 7/1996 | Danielson |
| 5,559,454 A * | 9/1996 | Schneider ............ H03K 17/952 327/4 |
| 5,712,621 A | 1/1998 | Andersen |
| 5,715,926 A | 2/1998 | Furneaux et al. |
| 5,786,997 A | 7/1998 | Hoyt et al. |
| 5,903,205 A | 5/1999 | Goto et al. |
| 5,911,627 A | 6/1999 | Piot et al. |
| 5,939,879 A | 8/1999 | Wingate et al. |
| 5,949,293 A | 9/1999 | Akamatsu et al. |
| 6,011,389 A | 1/2000 | Masreliez et al. |
| 6,175,232 B1 | 1/2001 | De Coulon et al. |
| 6,304,076 B1 | 10/2001 | Madni et al. |
| 6,366,078 B1 | 4/2002 | Irle et al. |
| 6,448,759 B2 | 9/2002 | Madni et al. |
| 6,483,295 B2 | 11/2002 | Irle et al. |
| 6,486,796 B2 | 11/2002 | Miyata |
| 6,522,128 B1 | 2/2003 | Ely et al. |
| 6,642,711 B2 | 11/2003 | Kawate et al. |
| 6,646,433 B2 | 11/2003 | Milvich |
| 6,828,783 B2 | 12/2004 | Schroter et al. |
| 6,850,054 B2 | 2/2005 | Kjellin et al. |
| 6,909,279 B2 | 6/2005 | Niwa |
| 6,926,115 B2 | 8/2005 | Masaki et al. |
| 7,012,462 B2 | 3/2006 | Kleine et al. |
| 7,016,744 B2 | 3/2006 | Howard et al. |
| 7,053,602 B2 | 5/2006 | Jin et al. |
| 7,061,230 B2 | 6/2006 | Kleine et al. |
| 7,071,685 B2 | 7/2006 | Saltsov et al. |
| 7,161,348 B2 | 1/2007 | Luber et al. |
| 7,183,761 B2 | 2/2007 | Watanabe et al. |
| 7,196,604 B2 | 3/2007 | Sills et al. |
| 7,317,367 B2 | 1/2008 | Gill |
| 7,345,473 B2 | 3/2008 | Lee |
| 7,538,544 B2 | 5/2009 | Lee |
| 7,652,469 B2 | 1/2010 | Meyer |
| 7,705,585 B2 | 4/2010 | Howard |
| 7,880,462 B2 | 2/2011 | Meyer |
| 7,944,215 B2 | 5/2011 | Howard et al. |
| 8,020,453 B2 | 9/2011 | Kriet et al. |
| 8,154,317 B2 | 4/2012 | Steedman et al. |
| 8,154,404 B2 | 4/2012 | Diener et al. |
| 8,278,945 B2 | 10/2012 | Howard et al. |
| 8,314,610 B2 | 11/2012 | Urano et al. |
| 8,350,561 B2 | 1/2013 | Lee |
| 8,378,660 B2 | 2/2013 | Steedman et al. |
| 8,395,379 B2 | 3/2013 | Habenschaden |
| 8,395,395 B2 | 3/2013 | Bruwer et al. |
| 8,421,446 B2 | 4/2013 | Straubinger et al. |
| 8,659,306 B2 | 2/2014 | Bruwer et al. |
| 8,847,892 B2 | 9/2014 | Kreit et al. |
| 8,854,309 B2 | 10/2014 | Deokar et al. |
| 9,157,768 B2 | 10/2015 | Reitsma et al. |
| 9,160,331 B2 | 10/2015 | Bakken et al. |
| 9,347,764 B2 | 5/2016 | Gilmore |
| 9,360,510 B2 | 6/2016 | Bruwer et al. |
| 9,366,547 B2 | 6/2016 | Forsyth et al. |
| 9,709,614 B2 | 7/2017 | Bruwer et al. |
| 9,780,780 B2 | 10/2017 | Sun et al. |
| 2007/0053622 A1 | 3/2007 | Gallion et al. |
| 2010/0308808 A1 | 12/2010 | Yamagata et al. |
| 2011/0187204 A1 | 8/2011 | Lacey et al. |
| 2013/0021023 A1 | 1/2013 | Niwa et al. |
| 2013/0069636 A1 | 3/2013 | Kim |
| 2014/0176159 A1 | 6/2014 | Pintiliuc et al. |
| 2014/0247040 A1 | 9/2014 | Reitsma et al. |
| 2014/0247090 A1 | 9/2014 | Reitsma |
| 2014/0327432 A1 | 11/2014 | Elliot et al. |
| 2015/0025772 A1 | 1/2015 | Gill et al. |
| 2015/0042343 A1 | 2/2015 | Zibold et al. |
| 2015/0123679 A1* | 5/2015 | Kuyvenhoven .... G06K 19/0717 324/652 |

FOREIGN PATENT DOCUMENTS

| | | |
|---|---|---|
| EP | 0 805 339 B1 | 11/2002 |
| EP | 1 975 570 B1 | 10/2014 |
| WO | 97/39312 A1 | 10/1997 |
| WO | 02/097374 A1 | 12/2002 |
| WO | 2004/102370 A2 | 11/2004 |
| WO | 2007/128972 A1 | 11/2007 |
| WO | 2007/129085 A2 | 11/2007 |
| WO | 2008/032008 A1 | 3/2008 |
| WO | 2008/035041 A2 | 3/2008 |
| WO | 2010/115497 A1 | 10/2010 |
| WO | 2013/089206 A1 | 6/2013 |
| WO | 2014/053835 A2 | 4/2014 |
| WO | 2015/038103 A1 | 3/2015 |
| WO | 2015/055382 A1 | 4/2015 |
| WO | 2015/090609 A1 | 6/2015 |

OTHER PUBLICATIONS

"Product Guide IncOder Inductive Angle Encoders", Zettlex UK Ltd, Rev. 4, Aug. 10, 2014, pp. 1-47.

Mark, H., "Slab Resolvers—An Explanation", Technical White Paper, Rev. 2.0, Zettlex UK Ltd, pp. 1-6.

Kreit, D., "Inductive Versus Capacitive Position Sensors", Technical White Paper, Rev. 2.0, Zettlex UK Ltd, pp. 1-7.

* cited by examiner

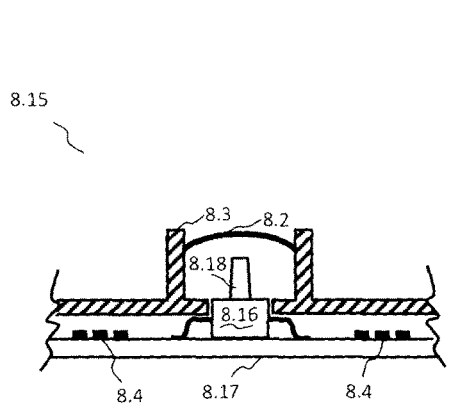
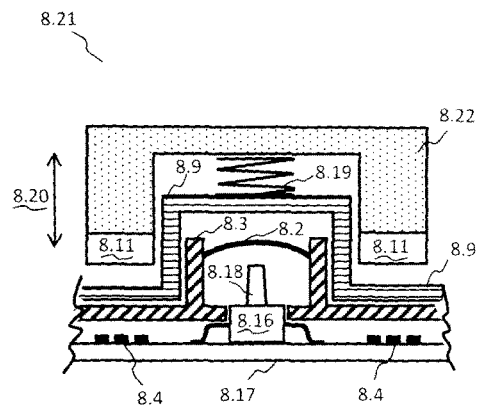
FIG. 8C        FIG. 8D
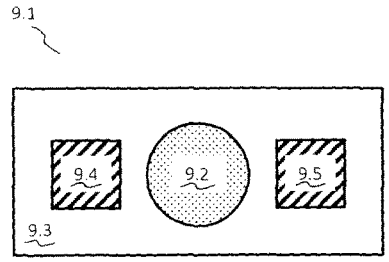
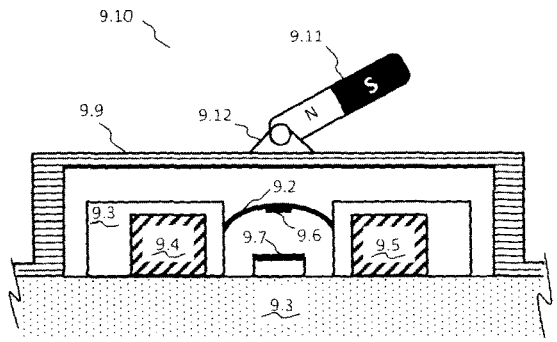
FIG. 9A        FIG. 9B
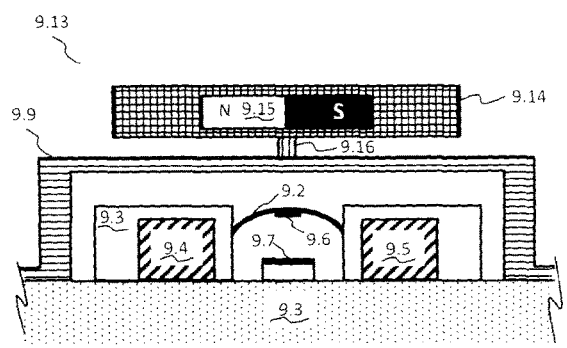
FIG. 9C

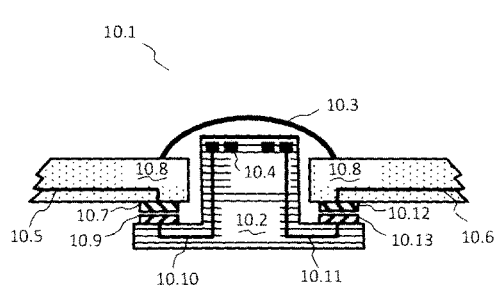 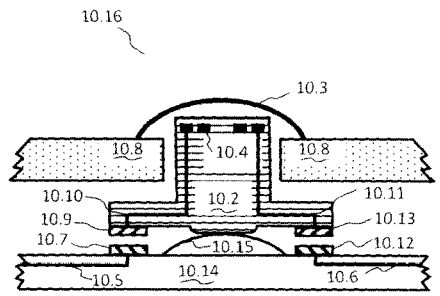
FIG. 10A　　　　　　　　　　FIG. 10B
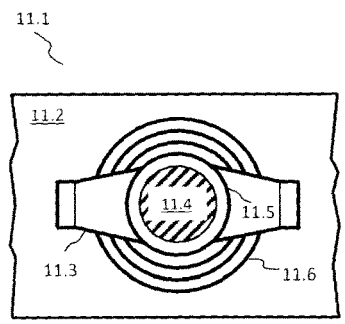 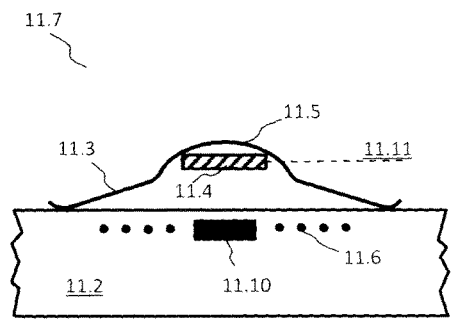
FIG. 11A　　　　　　　　　　FIG. 11B
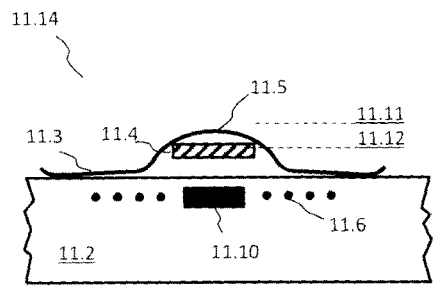 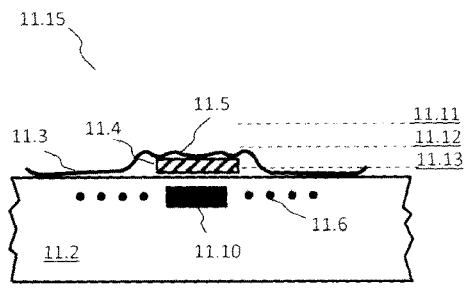
FIG. 11C　　　　　　　　　　FIG. 11D
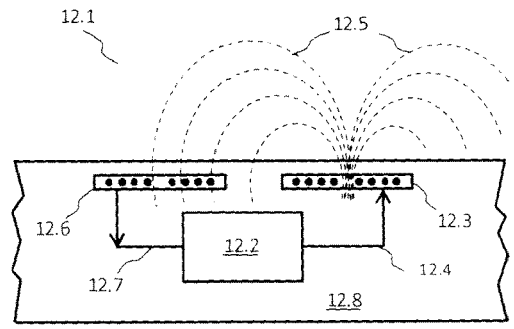
FIG. 12

INDUCTANCE SENSING

BACKGROUND OF THE INVENTION

The use of inductance related measurements to monitor the movement of targets is known in the prior art. In US2014/0247040 by Reitsma et al, a position detecting system is taught which measures the increase/decrease in the power loss for a time varying field due to an increase/decrease in eddy currents as a conductive target moves closer/further from a coil, where the coil generates said time varying field. Or alternatively, the quality factor of a tank circuit is measured, where a coil which faces a conductive target provides the inductive reactance for said tank, and use is made of a negative impedance circuit. In US2014/0247090 by Reitsma resonant impedance sensing based on generation of a controlled negative impedance to monitor a target is taught.

Charge transfer based measurement techniques for capacitive sensing are well known in the prior art. Further, compensation for parasitic capacitances and slow environmental factor drifts are also known. Refer specifically to U.S. Pat. Nos. 8,395,395 and 8,659,306, which both share inventors with the present application.

Further, the prior art holds a fair number of alternative technologies and methods for capacitive sensing. Among these is capacitive sensing based on a measured change in the amplitude of an alternating voltage due to a change in a sensed capacitance, or sensing based on a measured change in the characteristics of a pulse or pulses due to a change in a sensed capacitance, or sensing based on a measured change in an oscillation frequency due to a change in a sensed capacitance, or sensing based on a measured change in a resonant frequency due to a change in a sensed capacitance.

SUMMARY OF THE INVENTION

The present invention teaches measurement of inductance values through the use of a charge transfer based measurement system. For example, according to the present invention, during a first phase, a target inductor may be connected to the one or other energy source to allow current through said inductor to increase in amplitude up to a certain value, where the rate of current increase may be dependent on the value of said target inductance and the voltage of said energy source. Thereafter, during a second phase, the target inductance may be disconnected from said energy source, with current through the inductance gradually decreasing by flowing via a so-called free-wheeling diode, as is known in the art. During the second phase, the current which flows via said free-wheeling diode may be used to facilitate transfer of charge to an accumulation capacitor. That is, according to the present invention, an accumulation capacitor may be charged with said free-wheeling current, or a derivative thereof. After a certain period, or when the free-wheeling current has reduced to a certain level, said first phase may be repeated, with the target inductance connected to said energy source again, allowing the current in the inductance to build up again. This may be followed by, for example, another second phase, and so forth, with said accumulation capacitor progressively charged up during each second phase with energy stored in the target inductance, or a derivative thereof, during the preceding first phase. Said measurement system may keep track of the number of repetitions of said first and second phases, also known as charge transfer counts in the art. When the voltage on the accumulation capacitor reaches a certain value a comparator, which compares said voltage to a reference value, may trip, halting the process, whereby the number of charge transfer counts gives an indication of the value of said target inductance. This may be followed by the removal of charge from said accumulation capacitor, for example by short circuiting it, with a repetition of the above process. In an alternative embodiment, the process of repetitive first and second phases may also be halted after a certain number of charge transfer counts, with the voltage on said accumulation capacitor providing an indication of said inductance.

The above disclosure pertains mainly to a self-inductance measurement, wherein the target inductance may be directly connected to an input of a measurement circuit. However, according to the present invention, it may also be possible to measure the magnetic coupling between two distinct inductors, or the mutual inductance, with e.g. a charge transfer apparatus and method similar to what has been disclosed. For example, consider an embodiment where an energy source (i.e. a voltage source or a current source) may be connected via a first controllable switch to a first inductor during a first phase, and wherein said first inductor is magnetically coupled to a second inductor with a certain coupling factor. According to the present invention, said first switch may be periodically opened and closed, for example at 500 kHz, with a second phase defined as the period during which said first switch is opened. During said first phase, current builds in the first inductor. During the second phase, the present invention teaches that a second controllable switch, or a free-wheeling diode, may be used to facilitate the continued, but decaying, current flow in said first inductor. In other words said second switch or free-wheeling diode allows the current in the first inductor to free-wheel during the second phase. The first and second switches may be opened and closed in anti-phase, typically without any dead-time. That is, when said first switch is closed, the second switch is open, and vice versa. Further, the present invention teaches that the second inductor may be connected to an input of a circuit which facilitates the transfer of energy stored in the second inductor into an accumulation capacitor, for example a charge transfer circuit which employs a current mirror structure or structures to scale the current in the second inductor up or down. Due to the current flowing in the first inductor, energy is stored in it. With the above described switching during the first and second phases, energy may consequently be transferred from the first to the second inductor. The coupling factor between the two inductors may determine the amount of energy transferable. Due to the energy thus transferred from the first, or transmitter, inductor to the second, or receiver, inductor, current may flow in the second inductor, which may then be used to transfer energy to an accumulation capacitor, similar to that described earlier. The number of times said first or second phases need to be repeated to charge the accumulation capacitor to a predetermined level is counted, and may provide an indication of the coupling or mutual inductance between the first and second inductors. Alternatively, according to the present invention, the described mutual inductance measurement process may be halted after a certain number of repetitions of the first and second phases, and the voltage over the accumulation capacitor may be measured and used as an indication of the mutual inductance.

The present invention is not limited to the above. For example, instead of an accumulation capacitor, current which flow in said current mirror structures or structures due to current flowing in the second inductor, may be measured and used along with the measurement period to determine said mutual inductance value. As another example, a sine wave, or a square wave or a triangular wave generator may be used instead of the voltage or current source and said first switch to energize said first inductor with a specific frequency and amplitude. For example, in an embodiment for measuring a metric of the inductive coupling between two coils/inductors, the integrated circuit that performs the inductive measurement also generates a wave (e.g. block, sine etc.) as an output. This is fed into a first of said two coils which is designated as the primary coil and the energy transferred to the output of the second of said two coils, designated as the secondary coil, is measured. As the material affecting the "transformer" core, said core shared by the primary and secondary coils, is changed the transfer of energy is affected, giving an indication of change—for example when a ferrite or metal member approaches the area of coupling between the coils.

In mutual inductance measurement embodiments of the present invention which employ a current mirror structure or structures, the voltage across said receiver inductor may need to be higher than the forward biasing voltage of the input diode for the current mirror, before current may flow into and out of said mirror structure or structures. If the mutual inductance is small, or in other words a low coupling factor exists between the transmitter and receiver inductors, it may prove difficult to obtain a sufficiently high voltage across the receiver inductor. Since the voltage across an inductor is directly proportional to the rate at which current through the inductor changes, the present invention teaches that the voltage across the receiver inductor may be increased above said current mirror input diode biasing voltage by increasing the frequency of changes from said first phase to said second phase, or the magnitude of the current through the first inductor, or both.

Alternatively, the present invention teaches that a voltage source may be placed in series with the second, or receiver, inductor, wherein said voltage source is minimally less than said diode biasing voltage, and opposes it. In this manner, the input diode of the current mirror structure may always be biased to just below conduction, and only a small amount of energy may need to be coupled from the first, or transmitter, inductor to the receiver inductor to result in current flowing into said current mirror. This may facilitate measurement of relatively small amounts of mutual inductance.

When relatively small inductances, be it self- or mutual-inductance, for example on the order of 1 nH to 100 nH, have to be measured, a large current source may be required to obtain measurable voltages across the target inductance. For measurement solutions integrated into semiconductor devices, this may not be practical. However, according to the present invention, the target inductance, or another coupled inductance, may be resonated with a capacitor to obtain sufficiently large voltages across the target inductance, which may then be measured. For example, said target inductance, or another coupled inductance, may be place in series with a capacitor, with the series combination which may be driven by a square wave voltage or current source at the resonant frequency of the inductor and capacitor combination, as is known in the art.

Further, according to the present invention, all relevant techniques known in the art of charge transfer based capacitive sensing may be used to improve the disclosed apparatus and methods to measure the value of a target inductance. For example, current mirror structures may be used to generate the derivative of said free-wheeling current, allowing use of a much smaller accumulation capacitor than what would be the case if said capacitor is directly in series with said free-wheeling diode. Or compensation for parasitic inductances and capacitances may be performed, also with the aid of current mirror structures, as disclosed in U.S. Pat. Nos. 8,395,395 and 8,659,306, both which are incorporated in their entirety. Or said measurement system may determine a Long Term Average (LTA) of charge transfer counts for a specific target inductance, and use the LTA with digital filtering techniques to compensate for longer term or slow changes, such as, for example, due to temperature, component aging and so forth.

Naturally, in the preceding disclosure, the charge transfer measurement system for inductance measurement may be realized with an integrated circuit, comprising e.g. a single die or multiple dies within a single package. Further, the inductance measurement circuit disclosed may also be included in multi-sensor integrated circuits. That is, according to the present invention, a single integrated circuit may be realized which may have the ability to use charge transfer based measurement of signal currents to facilitate measurement of e.g. capacitive proximity or touch, ambient light levels, PIR sensor currents, magnetic field strength or orientation and inductance, wherein the same charge transfer measurement circuit is used for all measurements.

In another related exemplary embodiment of the present invention, the freewheeling diode in the preceding disclosure on inductance measurement may be replaced by a transistor which is controlled by the measurement system. In other words, said transistor may be turned on during said second phase to allow the current of the target inductance to free-wheel, albeit with possibly smaller power losses than what is experienced with a diode.

According to the present invention, the inductance being measured with a charge transfer process as disclosed above may also reside on-chip. That is, an inductor may be purposefully realized on the silicon of an integrated circuit (IC), e.g. on the same die as the disclosed charge transfer measurement system or on a separate die, or the inductor may be realized in some other manner within the packaging of said IC, and the value of said inductor may be measured with said measurement system. The inductance to be measured may naturally also be external to an integrated measurement circuit, as disclosed earlier. Such an arrangement may allow the measurement system to monitor and measure movement of material which is external to the integrated circuit packaging, wherein said material may influence magnetic fields generated by said inductance/inductor when current flows through it. For example, movement of a metal sheet closer to and further from the integrated circuit may be detected, due to the associated change in inductance of the on-chip inductor. Or, in another exemplary embodiment, the rotation speed of a metal wheel positioned over such an integrated circuit may be measured, with said wheel having notches or gaps in its periphery, resulting in a sequentially increasing/decreasing amount of metal over the IC. Use of such gapped wheels is well known in the art of Hall plate based rotation sensors.

In addition, the present invention teaches that if two inductors are realized on-chip, it may be possible to discern both the rotation direction and speed of e.g. a gapped or notched metal wheel, or another structure, with a charge transfer based measurement of inductance values as disclosed, wherein said wheel would typically, but not necessarily, be positioned in close proximity to said chip or IC, and where the notches or gaps may be spaced equidistant around the circumference of the wheel. Or, in another exemplary embodiment, a single on-chip inductor may be used with the disclosed charge transfer measurement system to discern both rotation direction and speed of a metal wheel, or another structure, wherein the wheel may be characterised by a pattern of notches or gaps which is not uniform over its circumference. For example, gaps in the wheel's periphery may become consecutively wider as the wheel is rotated, with the widest gap being adjacent to the narrowest gap. Or said wheel may have, e.g., a non-uniform thickness over its circumference, continually becoming thicker until it reaches a maximum, followed by a step back to a minimum thickness. Or, e.g., said wheel may have slots cut into it, where the slots have dimensions which vary according to the one or other distinct pattern as said wheel is rotated. What is paramount is that the present invention teaches sensing of the rotation speed and/or direction of a metal wheel, or another structure, with a charge transfer based integrated measurement circuit, and wherein an inductor being sensed with said measurement circuit may be realized on-chip, with said wheel or other structure having dimensions and structural details which vary sufficiently to allow said sensing of rotation speed and/or direction.

Further, the present invention teaches that an on-chip or off-chip coil or inductor may also be used as a capacitive sensing electrode. The capacitance measurement for said electrode may be performed with the same charge transfer measurement circuit used to measure inductance, as disclosed earlier, or another capacitance measurement circuit may be used. For example, according to the present invention, an on-chip coil may be used as an electrode for self-capacitance measurements, where only one end of the on-chip coil is connected to the charge transfer measurement circuitry on the chip. Or both ends of said coil may be connected together, with the connection node which may then be used to measure the self-capacitance of the shorted-out coil. The coil may also be off-chip, naturally. Such self-capacitance measurements may be used, e.g., to detect user proximity to the IC, whereupon the IC may be returned to a more active operating mode, with higher power consumption, and during which the inductance of said coil is measured. Naturally, the invention is not limited to a self-capacitance measurement with a coil, and projected capacitance may also be measured with a coil or coils, as will be detailed later by the present disclosure.

To overcome prior art limitations of mechanical tactile or dome switches, and specifically of sealing arrangements for these switches, as is used in underwater camera housings, for example, the present invention teaches combining a tactile switch with a Hall-effect sensor or a coil, and utilizing measured changes in magnetic field or inductance to improve determination of switch activation or deactivation and to increase the simplicity and cost-effectiveness of sealing arrangements for said switches. Said changes in magnetic field or inductance may be due to the movement of, e.g., permanent magnets or the one or other material which influence magnetic fields emanating from said coils. In one exemplary embodiment, a Hall-effect sensor is located underneath a dome switch, and movement of a magnet external to a rigid or semi-rigid cover for a hosting device, e.g. a camera, is detected by said Hall-effect sensor and used as indication of switch activation or deactivation. In another exemplary embodiment, a coil is integrated into the structure that surrounds a dome switch and used to detect movement of a metal plate external to a rigid or semi-rigid, liquid- or gas-proof cover for a hosting device, and wherein said detection is used as indication of switch activation or deactivation. Or in yet another exemplary embodiment, said coil is located on a PCB which also houses a push-button type switch. The present invention further teaches embodiments where more than one Hall-effect sensor or coil is placed in the vicinity of a dome or tactile switch, and used to detect the rotation of e.g., magnets or metal members respectively, with said magnets or members external to a rigid or semi-rigid cover for a hosting device, with the cover being liquid-proof or gas-proof. In the preceding, inductance measurements may be performed where relevant with a charge transfer based measurement circuit as disclosed.

Further, the present invention teaches that a double action switch may be realised which uses, e.g., charge transfer based inductance sensing as disclosed, and wherein said switch may make use of a dome structure formed in a resilient material, for example plastic or metal, with said structure characterised by a first nominal state, a second deformed state and a third snapped-through state. The state of the structure and switch may be dependent on the amount of pressure applied to the dome structure, with said first, second and third states which may for example be characterised by a sequentially decreased distance between a member made out of metal, or another material, and the coil or inductance being sensed or measured. Said member may be attached to the dome structure and may influence the magnetic field of said coil, and therefore also the measured or sensed inductance value. That is, if no pressure is applied to said dome structure, said member out of metal, or another material, may be the furthest away from said coil, with the double action switch in said first nominal state. If a first amount of pressure is applied to the dome structure, the dome may deform, bringing said member closer to said coil. This second deformed state may be detected by a charge transfer based circuit as disclosed by measuring a first change in the inductance for said coil. If more than a second amount of pressure is applied to said dome structure, it may snap-through, bringing said member out of metal, or another material, yet closer to said coil. This third snapped-through state may be detected by a charge transfer based circuit as disclosed by measuring a second change in the inductance for said coil.

The double action switch as disclosed in the preceding may be used to realize a liquid- or gas-proof switch, e.g., with said coil and the charge transfer based inductance measurement circuit located within a sealed product housing, and said dome structure and the attached metal member located outside the housing. The dome structure may be designed as an open structure, allowing liquid or gas to move freely around it and thereby equalize the static pressure applied by the liquid or gas to the dome structure. This may prevent an increase in liquid or gas pressure, for example when diving deeper into water, from activating the disclosed double action switch.

Further, according to the present invention, the above mentioned metal member and dome structure may be one and the same, as another example. In other words, the dome structure may be made from metal or any other material which influences the magnetic field of the coil and therefore its inductance value, without the requirement of a separate member attached to the dome structure. Said coil may for example also be realized on-chip, or within the packaging of an IC, wherein said IC may comprise a charge transfer based inductance measurement circuit as disclosed.

According to the present invention, sealed switch structures as disclosed, and others, may also benefit from inductance sensing performed at a sufficiently low charge transfer, or other, frequency to allow said sensing to penetrate through metal structures used for said sealing, of for another purpose, and thereby sense movement of members with relatively high relative magnetic permeability or with high eddy current losses, wherein said members are situated on the opposing side of said metal structures to the coil used for the inductance sensing. For example, an inductance sensing apparatus as disclosed may be used in a white goods appliance, for instance a stove, and may monitor the movement of a member with high relative permeability, wherein said member is located in a knob of the stove, and wherein the sensing apparatus monitors the position of said knob through the metal housing of the stove, with the charge transfer frequency of said inductance sensing apparatus being sufficiently low to allow monitoring through the metal. As is known in the art, if the frequency is too high, the skin depth for the metal used may become less than the thickness of said housing, which may prohibit magnetic fields emanating from the coil used for said sensing to penetrate through the housing.

In the above described double action switch, a magnet attached to the dome structure may be used instead of a metal member, along with a Hall plate sensing circuit to detect changes in magnetic field intensity as the dome structure changes between said nominal, deformed and snapped-through states due to applied pressure. The Hall plate sensing circuit may make use of, for example, charge transfer measurements.

Charge transfer based inductance sensing as disclosed may also be used to detect magnetically coupled pulses in a receiver coil, according to the present invention. Accordingly, a driver coil may be pulsed by a circuit and the magnetic field of said driver coil may be coupled by a coupling member to said receiver coil. Typically, the coupling member may be formed from material with a high relative magnetic permeability. As the pulses are coupled to said receiver coil, a charge transfer based inductance sensing circuit, e.g., may detect a difference in the number of charge transfers performed when a pulse is coupled and when no pulse is coupled. It is also envisaged that said pulses may be furnished with the one or other pattern in terms of time or amplitude, to allow easier and more accurate detection of pulses received by the receiver coil. Said pattern may, e.g., also contain modulated data. Further, the same circuit may be used to pulse said driver coil and to detect pulses coupled to said receiver coil via a charge transfer inductance measurement as disclosed. Said circuit may also be an integrated circuit.

Such a charge transfer based inductance sensing circuit with a driver and a receiver coil shares some analogy with a charge transfer mutual capacitance sensing circuit. It may be used in a large number of sensing applications, where perturbation of the coupled magnetic field between said driver and receiver coils may be detected and used as an input or inputs into any electronic circuit or system.

For example, in one embodiment, a rotary switch may comprise a magnetic field coupling member out of material with a relatively high magnetic permeability. When the switch is in a first position, said coupling member may effectively couple a pulsating magnetic field of the driver coil into the receiver coil, allowing detection of the first position. When the switch is rotated to a second position where said coupling member is not aligned with both the driver and receiver coils, an associated change may occur in the number of charge transfers measured for said receiver coil, allowing detection of the second position.

In another exemplary embodiment, a switch comprises a magnetic field coupling member which may be in both a vertical or horizontal orientation, depending on the switch status, and wherein said coupling member has a high magnetic permeability. When said coupling member is in a horizontal orientation, it may lie parallel to the plane of the driver coil, resulting in pulsating fields from the driver coil being effectively coupled into the receiver coil, and a first charge transfer count value or values. If the coupling member is turned into a vertical orientation due to a switch status change, one end of the coupling member may be located over the centre of the driver coil, resulting in magnetic fields not coupling effectively into said receiver coil, and a second charge transfer value or values which differs measurably from the first value.

The present invention further teaches that said driver and receiver coils may not only be used for inductance measurement with a charge transfer based method as described earlier, but may also be concurrently or sequentially used for a mutual capacitance measurement, as an exemplary alternative measurement. That is, the driver and receiver coils may be used as coils for the measurement of inductance or magnetic field strength as disclosed, but may also be used as transmitter and receiver electrodes for capacitive sensing, as is known in the art. In other words, a combined or hybrid antenna/coil/electrode may be implemented to perform both capacitive and inductive sensing measurements of adjacent objects. This has several advantages such as cost, space and measuring both parameters for the same position or location. For inductance sensing, both ends/terminals of each coil may be connected to either an electrical energy source or a measurement circuit as disclosed earlier. For mutual capacitance sensing, only one end/terminal of each coil is connected to either a driving circuit, or a receiving circuit. Or as an exemplary alternative, both ends/terminals of each coil may shorted together, and the common point thus created may be connected to either a driving circuit, or a receiving circuit. Distinct or separate structures may also be used for said inductance and said capacitance measurements. In addition, the present invention teaches than the disclosed inductance and mutual capacitance sensing with the same coil or electrode pair may be performed in for example a mixed or sequential fashion, and that the information gathered from the inductance and capacitance measurements may be used in a number of ways. For example, it may be used to identify the nature or kind of material in close proximity to said coils/electrodes. Or the information gathered from the two types of measurement may be used in a complementary fashion to ensure that only a certain type of probe may engage a user interface or activate a switch. Or it may be used to improve noise immunity of a capacitive sensing circuit, an inductance sensing circuit or both. The number of embodiments of the present invention which may use such a combined mutual capacitance and inductance sensing with the same coils/electrodes is potentially vast, as those skilled in the art will appreciate. Application of the above may be especially advantageous in wearable consumer electronic devices. For example, consider the case where wireless headphones comprise an embodiment of the invention as described, and are placed on a metal surface. With capacitive sensing, the presence of said metal surface may be detected, and may be erroneously interpreted as a user proximity or touch gesture. However, due to a concurrent, subsequent or otherwise related inductance measurement, using the same or other sensing structures and the same or other sensing circuitry, the embodiment of the present invention may determine that it is a metal surface, as an example, interfacing with said headphones, and not a user's finger or head. This information may then be used to negate or cancel any decisions made which are based on only capacitive sensing results. Naturally, the information gleaned from said inductance measurement may also be used to confirm or validate information obtained from said capacitance measurement, for example when a user's head is close to said headphones, the inductance measurement may typically show that no metal is close to the headphones.

In the above, it is to be appreciated that the present invention is not limited to the use of charge transfer based measurements, but any of the capacitive measurement methods and technologies held by the prior art, as discussed earlier, may be used as basis for both said capacitance measurement and said inductance measurement. Further, the invention should not be limited in the above to only mutual capacitance measurements performed in conjunction or together with inductance measurements, but self- or surface-capacitance measurements may also be made and used, and the inductance measurements may be either self-inductance or mutual inductance measurements.

In another example, an integrated circuit embodying the present invention which can perform both capacitance and inductance measurements as described, may be used in security related applications, for example as part of an alarm system, wherein inductance measurements may be used to detect the open/close status of a window or door, and capacitive sensing may be used to detect when a person touches a window, a door, a surface, a specific object, and so forth.

In another example, combined capacitance and inductance sensing which utilize the same structure or structures as a capacitive electrode or electrodes and as an inductive coil or coils, may advantageously be used in Specific Absorption Rate (SAR) protection applications, to identify when human bodies are in closed proximity to an electronic device. By performing related capacitance and inductance measurements with said structure or structures the material type in proximity to the structure or structures may be more readily identified, and used for SAR protection application decisions. For example, said related capacitance and inductance measurements may be used to determine if a human or an inanimate object is in proximity to a product such as a tablet computer, to name one of many possible products. If the inanimate object is, for example, a metal table said related capacitance and inductance measurements may be used to identify it as such. Consequently, the product may decide not to reduce the amplitude of its radio-frequency (RF) transmissions. Or alternatively, such measurements may be used in a mobile electronic device, for example a smart phone, to identify the manner in which said electronic device is gripped by a user, which may then be used to determine which antennas to use for wireless transmissions.

Further, the present invention teaches that the same IC may, e.g., comprise SAR protection application circuitry, inductance measurement circuitry and capacitance measurement circuitry as discussed and disclosed. The same or distinct or separate structures may also be used as coil or inductor for inductance measurements, as electrode for capacitance measurements and as antenna for RF transmission and reception, as examples according to the invention. Said structures may also be realized on-chip, that is on or within the IC structure or packaging, or on a substrate carrying the IC, for example a PCB, or on both.

It may be advantageous to realize embodiments where inductance sensing apparatus have the ability to detect or "see" metal layers or members in proximity to the apparatus, but also have the ability to detect beyond, or "see through" said metal layers or members, and wherein the two modes of operation are selectable. According to the present invention, such an embodiment may be realized by having an adjustable charge transfer frequency, or another frequency, in the inductance sensing apparatus. If the charge transfer frequency is high enough, the skin depth for the metal of said layers or members should be less than the thickness of the layers or members, and the inductance sensing apparatus as disclosed may be able to detect or "see" the presence of the metal. Conversely, if the charge transfer frequency is low enough, the skin depth for the metal of said layers or members should be substantially more than the thickness of the layers or members, allowing said apparatus so sense beyond or "see through" the metal. Such an embodiment of inductance sensing apparatus may advantageously be applied for SAR measurements, or for the detection of laptop open/close status and so forth.

Combined or related inductance and capacitance measurements as described above may also be used with other measurement technologies, for example active infra-red (IR) measurements. The same or different circuits may be used to perform said combined or related inductance and capacitance measurements and the active IR measurements. For example, active IR measurements may be used to provide information on the distance to a sensed object, and capacitance and inductance measurements, or one or the other, may then be used to determine material characteristics of the sensed object, for example its metal content. Other methods or technologies to determine the distance, or approximate distance, to the sensed object may also be used, according to the present invention.

Further, the present invention teaches that inductance sensing as disclosed may be used to determine the metal composition of objects or members in proximity to a coil or coils. Different metals have different values for conductivity and relative magnetic permeability. Accordingly, at a given frequency or frequencies, different metals will load a coil or coils differently, or increase magnetic field strength emanating from said coil or coils differently. If the loading or magnetic field strength enhancing characteristics for members out of various metals, but of a predetermined size and thickness, are known beforehand, the metal composition of unidentified members of similar size and thickness may be calculated or estimated, according to the present invention.

Metal composition determination with inductance measurements as disclosed may also be advantageously used in security related applications. For example, inductance measurements as disclosed may be used to determine the metal composition in bank notes, in an effort to identify counterfeit notes. Said inductance measurements and metal composition identification may further be used in conjunction with capacitive and optical measurements to further increase the accuracy with which counterfeit notes may be identified. Indeed, the present invention teaches that the same charge transfer circuit or circuits may be used to measured inductance, capacitance and for optical measurements and wherein the listed measurements may be used in conjunction to identify counterfeit banknotes, for example.

If, in some of the above disclosed embodiments, said coupling member with high magnetic permeability is replaced by a member out of metal, e.g. aluminium, and the driver and receiver coils are arranged alongside each other, that is with different magnetic field axis, coupling between the coils may reduce to below that obtained with air as a coupling medium. This is typically caused by eddy currents in the metal member which consumes energy stored in the driver coil magnetic field. In other words, for mutual inductance measurements, a coupling member with high relative magnetic permeability may be used to increase the amount of magnetic energy transferred from a driver coil to receiver coil, and a metal member may be used to reduce the amount of energy transferred, said reduction caused by eddy current losses. Conversely, for self-inductance measurements, a member with high relative magnetic permeability may be placed over or in close proximity to the measured coil or inductance, thereby increasing the amount of energy stored in the magnetic field of said coil or inductor, and if a metal member is placed over or in close proximity to said coil, the amount of energy stored may be reduced due to eddy current losses.

The present invention also teaches that for the embodiments disclosed earlier, and hereafter, that interchanging mutual inductance measurements with self-inductance measurements, and vice versa, may be possible in some or in all embodiments.

According to the present invention, if driver and receiver coils are co-centric, or share the same magnetic axis, the presence or absence of a metal member over or in close proximity to the coils and the corresponding significant change in charge transfer counts may be used advantageously in for example user interfaces, rotation sensors, movement sensors and switches, to name but a few. When the driver and receiver coils are co-centric, sufficient coupling may be obtained when no metal member is present over or in close proximity to the coils to perform charge transfer measurements as disclosed. When the metal member is moved over or into close proximity of the coils, little or no magnetic field may couple to the receiver coil, resulting in a substantial change in the number of charge transfers.

In one exemplary embodiment, the driver coil, the receiver coil or both coils may be realised on-chip or within the package of an IC which comprise charge transfer based inductance measurement circuits as disclosed. One or both of said coils may also be realized on a substrate in close proximity to the IC, for example a PCB on which said IC is mounted. Further, the present invention teaches that said IC may use a modified metal flag on which to mount the semiconductor chip, to avoid excessive loading of the driver and/or receiver coils by eddy currents in said flag. For example, a flag with a fairly large hole in it may be used. Or it may be manufactured from the one or other material which do not result in substantial eddy currents in the flag, or the material may have good magnetic permeability.

Co-centric driver and receiver coils as disclosed need not lie on the same plane. For example, according to the present invention, the driver and receiver coils may be located on either side of a rotating aluminium wheel, which may also be made from another metal. Slots in the wheel may cause the discussed presence or absence of metal over the driver coil, with the resulting significant changes in charge transfer counts for the receiver coil. Such an exemplary embodiment may be used to realize a mouse scroll wheel sensor with very low cost, without any magnets, Hall effect sensors, infra-red transmitter and receivers etc. In another related exemplary embodiment, the driver and receiver coils may be on the same side of a rotating wheel, but on different planes. One of the coils may reside on the IC which performs said charge transfer measurements and the other coil may be realized on the PCB carrying the IC, but with the same magnetic axis for both coils. For example, the driver coil may be on the IC, or within the IC packaging, and the receiver coil may be realized around the IC on the PCB upon which the IC is soldered. A rotating wheel, for example a mouse scroll wheel, may cause metal to move closer and further to said IC, allowing measurement of wheel rotation speed and/or direction. Holes, notches, slots and tabs in the metal or wheel, as discussed earlier during the present disclosure, may be used to facilitate the measurement of rotation speed and/or direction.

In a related embodiment to the above, said rotating metal wheel may contain a member with high relative magnetic permeability at a specific point of the wheel circumference, wherein the member may cause significantly improved coupling between said driver and receiver coils. As such, said member may provide, for example, a null-point from which to measure absolute wheel rotation. When said wheel rotates, the metal wheel may cause significantly reduced coupling between the driver and receiver coil, which may also be measured in terms of a change in charge transfer counts. As notches, slots or other periodic changes in the metal structure of the wheel move past the magnetic axis of said driver and receiver coils, coupling may momentarily increase. However, when said member with high relative magnetic permeability moves past, coupling should increase to a much higher level for a short period, which may then be used as a null-point for absolute wheel rotation measurement, as an example.

In another exemplary embodiment, a receiver coil as disclosed may reside on an IC, and a pulsing driver coil as disclosed may move past the IC, for example in a linear motion or in a circular motion. This may be used to detect movement, measure rotation speed of a wheel, and so forth.

A number of driver coils may also be arranged in the one or other pattern around, e.g., a central receiver coil, and a coupling member with high magnetic permeability, for example a piece of ferrite, may be located between one of the driver coils and said receiver coil, according to the invention. Further, it may be possible to change the position of said coupling member to place it between another of said driver coils and the receiver coil. By energizing each of the driver coils in turn and measuring the inductance of said receiver coil, the position of said coupling member may be determined, wherein a charge transfer based inductance measurement as disclosed may be used. Such an exemplary embodiment may advantageously be used to realize selector switches or user interfaces, specifically for use underwater or within other environments which require complete sealing of product housings. As an exemplary embodiment, said coupling member may be located within a dial, for example made of plastic, located on the outer surface of a sealed product housing, and the driver and receiver coils may be located within said housing, and used in a underwater diving selector switch. It is to be appreciated that in the preceding, the driver and receiver coils may also be interchanged. For example a single driver coil may be located central to a number of surrounding receiver coils, and wherein said receiver coils are measured in turn to determine the location of the coupling member.

According to the present invention, a dial switch similar to that disclosed above may be realized, as an exemplary embodiment, with the difference that use is made of self-inductance measurements. Accordingly, a number of coils or inductances may be arranged in the one or other pattern, for example a circle, wherein said coils may be realized on a substrate, for example a PCB, with said substrate which may be located within the one or other sealed housing. A charge transfer measurement circuit or circuits as disclosed may be used to measure the self-inductance of each coil. The invention is not limited to charge transfer measurements in this regard. A knob or dial may be located external to said sealed housing, concentric to said circular pattern of coils, as an example. A metal member, or a member with high relative magnetic permeability, may be located within said knob or dial, wherein rotation of said knob or dial may result in said member sequentially lying over or in proximity to a different coil or coils of said number of coils. Accordingly, when said member is fashioned out of metal, its location over a particular coil may result in a decrease in measured self-inductance for the particular coil due to eddy current losses. If said member is fashioned out of material with high relative magnetic permeability, its location over a particular coil may result in an increase in measured self-inductance for the particular coil.

It may also be possible to realise a dial switch with improved robustness for the detection of switch position, according to the present invention. As before, a number of coils may be positioned on a substrate, for example a PCB, in the one or other pattern around a central coil, for example a circular pattern, and said coils may be located inside a sealed housing with a dial switch or knob external to said housing. A member with high relative magnetic permeability may be located within said dial or knob such that it facilitates improved coupling between said central coil and a first of the coils in said pattern surrounding the central coil. In addition, a metal member may be located within said dial or knob such that it reduces the coupling between said central coil and a second of the coils in said pattern. In a preferred embodiment, the first and second coils may be in line with each other, with the central coil at their centre, although this need not be so. By requiring both said increase in measured coupling between the first coil and the central coil, and the decrease in measured coupling between said second coil and the central coil, circuitry which monitor and annunciate the position of said dial switch or knob may become more robust and less prone to provide incorrect position information. For example, if a piece of metal is inadvertently placed close to said second coil, it should result in only said decrease in coupling, and a change in switch position may not be communicated. In other words, as the knob or dial switch is turned, its position may be accurately determined by noting which of the coils in said pattern shows increased coupling with said central coil, and which coil in said pattern shows a significant decrease in coupling with the central coil.

In another exemplary embodiment of the present invention, a number of coils or inductors may be located in an array on a substrate, for example a PCB, or the coils may be fashioned out of ITO on a transparent substrate, wherein said array of coils may be used with mutual inductance measurements as disclosed to sense the location and movement of an object, for example a passive stylus. Specifically, the present invention teaches that each, or some, of said coils in the array may be used in turn as a transmitter coil, while the other coils in said array functioning as receiver coils. That is, a first coil in the array may be driven as transmitter coil while the other coils function as receiver coils, where-after another of the coils in said array may be driven as a transmitter coil, with all other coils, including said first coil, functioning as receiver coils, and so forth. In practical terms, only the receiver coils in the immediate vicinity of a particular transmitter or driver coil may need to be measured, although the invention is not limited to this. If said passive stylus, or another object, contains a member with high relative magnetic permeability, for example a piece of ferrite, or a member out of metal, it may influence the coupling between a particular transmitter coil and the receiver coils measurably. For example, if said stylus contains a ferrite member in its tip, it may enhance the coupling of a particular transmitter coil to the surrounding receiver coils. By sequentially using each coil in said array as a transmitter coil, and measuring the coupling to the surrounding coils which function as receivers, the location of said stylus with the ferrite member may be identified as an area with high coupling between transmitter and receiver coils. Similar to methods used for capacitive sensing touch screens or touch pads, embodiments of the present invention may make use of multiple measurements and statistical techniques to determine the location of said stylus from inductance measurements for said array. In addition, although the invention should not be limited in this regard, the dimensions of said coils and ferrite member may need to be small enough to detect the location of said stylus with high enough resolution for practical use, for example for drawing. If said stylus contains a metal member in its tip, the method as disclosed above may also be used, with the difference that an area of low coupling between a transmitter coil and receiver coils may indicate the location of the stylus, due to eddy current losses caused by the metal member.

In prior art capacitive sensing 2D touch pads and touch screens, diamond shaped electrode structures are often used in arrays for the sensing of position and movement. The present invention teaches that a variation of such diamond shaped structures may be used for both inductance and capacitance measurements or sensing. Traditional diamond electrode structures may be modified into a diamond shaped spiral, which may function as a coil for inductance measurements. In other words, the two ends of said spiral may be used for inductance measurements, whether self-inductance or mutual inductance. For capacitance measurements, only one end or terminal of said spiral may be used, either for self-capacitance or mutual capacitance. Alternatively, the present invention teaches that the two ends or terminals may be shorted together for capacitance measurements, for example by using switches on an IC connected to said coil, wherein said IC comprises charge transfer measurement circuitry which may be used for said inductance and capacitance measurements. Further, an array of such diamond shaped spirals or coil structures may be used with inductance sensing as disclosed to monitor the location and movement of a stylus with, for example, a ferrite member in its tip, and then also to monitor the location and movement of a user's finger or fingers with capacitance sensing as is known in the art. A controlling IC may be used to alternately short the ends of the coils in said array together for capacitance measurements, or to leave said ends apart, for inductance measurements. Said controlling IC may also be used for said inductance and capacitance measurements, using for example a charge transfer circuit and method similar to what has been disclosed.

It is taught and envisaged by the present invention that embodiments as disclosed in the preceding, and as will be disclosed hereafter, do not necessarily need to be based only on charge transfer based inductance sensing, but may alternatively use inductance sensing based on any of the capacitive sensing technologies and methods held by the prior art, some of which have been discussed above. In other words, the present invention envisages, teaches and claims that it may be possible to perform inductance sensing by using any of the capacitive sensing technologies and methods held by the prior art wherein the sensed capacitance is exchanged for a sensed inductance, with some other changes as may be required by the specific technology or method, and that said inductance sensing may be used in any of the embodiments, or reasonable variations thereof, as disclosed in the preceding or remainder of this specification. The present invention therefore teaches that the relative or absolute size of a passive element, which may be an inductance or a capacitance, may be determined with a measuring process which stores an amount of energy inductively or capacitively in said passive element, and then withdraws an amount of energy from that stored, and uses said withdrawn energy, or a derivative thereof, as a metric to determine said size of said passive element.

The present invention further teaches that a charge transfer measurement process may be used to realize an on-chip gas sensor, for example a $CO_2$ sensor, and that such a sensor may be utilized in a mobile electronic device. For example, a smart phone may employ said on-chip, charge transfer based $CO_2$ sensor and utilize it a fire or smoke detector to alert users.

BRIEF DESCRIPTION OF THE DRAWINGS

The invention is further described by way of examples with reference to the accompanying drawings in which:

FIG. 8A to 8D show exemplary embodiments of the invention wherein a tactile switch and inductance sensing of a coil is combined, and used in a cover for underwater or highly explosive environment application.

FIG. 9A to 9C show exemplary embodiments of the present invention in the form of a tactile switch in combination with two adjacent Hall sensors, and the use thereof with corresponding magnets to realize underwater or highly explosive environment switches.

FIG. 10A to 10B show exemplary embodiments of the present invention in the form of a tactile switch and sensing of coil inductance, wherein the coil is embedded in the switch, and additional contacts are used to enable/disable inductance sensing.

FIG. 11A to 11D show an exemplary embodiment in the form of a double action dome switch based on inductance sensing to facilitate complete liquid or gas proofing.

FIG. 12 shows an exemplary embodiment where a driver coil is pulsed and a charge transfer measurement circuit detects corresponding pulses of magnetic field coupling into a receiver coil.

DETAILED DESCRIPTION OF EMBODIMENTS

The following description of the appended drawings is presented merely to clarify the spirit and scope of the present invention, and not to limit it. It should be understood that these are exemplary embodiments, and a large number of alternative embodiments may exist which still fall within the scope of the claims for the present invention.

Figure 1:
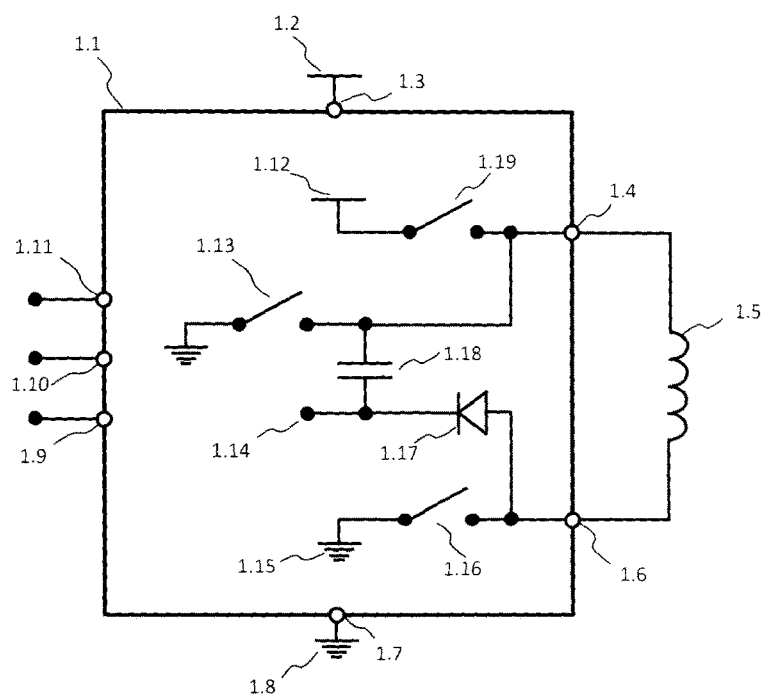
FIG. 1 shows an exemplary embodiment of a charge transfer based inductance measurement system.

An exemplary embodiment of the present invention is illustrated by FIG. 1, where a target inductance 1.5 may be measured with, e.g., a charge transfer based measurement circuit 1.1. The circuit may receive electrical power via terminals 1.3 and 1.7, connected to a voltage bus 1.2 and ground 1.8 respectively. Target inductance 1.5 may be connected to the circuit via terminals 1.4 and 1.6. The circuit may have other terminals, such as 1.9, 1.10 and 1.11, which may be used for example for communication, control or other functions. During a first phase of circuit operation, inductance 1.5 may be connected to a circuit internal voltage bus, or current source (not shown), 1.12 and to ground 1.15 by closure of switches 1.19 and 1.16. This may result in current flowing through inductance 1.5 and increasing according to the voltage present across said inductance. During a second phase, when switches 1.19 and 1.16 are opened, current through said inductance may free-wheel via diode 1.17 and capacitor 1.18, which may result in an increasing amount of charge stored in said capacitor. The free-wheeling current may gradually decrease as more energy is stored in capacitor 1.18 in the form of transferred charge, until the magnetic energy remaining in inductance 1.5 is not sufficient to ensure further capacitor charging, or if switches 1.19 and 1.16 close again to start a new first phase, which may allow current in said inductance to increase. Dependent on the relative sizes of inductance 1.5 and capacitor 1.18, and the amplitudes of the relevant voltage and currents, a number of repetitions of said first and second phases of charge transfer may be required before capacitor 1.8 is charged to a predetermined voltage. The voltage of capacitor 1.18 may be measured at point 1.14 relative to ground by closing switch 1.13 while switches 1.19 and 1.16 are open, although the present invention is certainly not limited in this regard. Measurement circuit 1.1 may keep track of the number of charge transfers, or charge transfer counts, required to fill capacitor 1.18 to a predetermined voltage, or may measure a time count to obtain said predetermined capacitor voltage. Alternatively, measurement circuit 1.1 may halt the measurement process after a number of charge transfers, and measure the voltage across capacitor 1.18. In either case, the transfer counts, time counts or capacitor voltage may be used by said system to determine the inductance value of target inductance 1.5. The preceding is merely provided as an exemplary manner in which the embodiment illustrated in FIG. 1 may function.

Figure 2A:
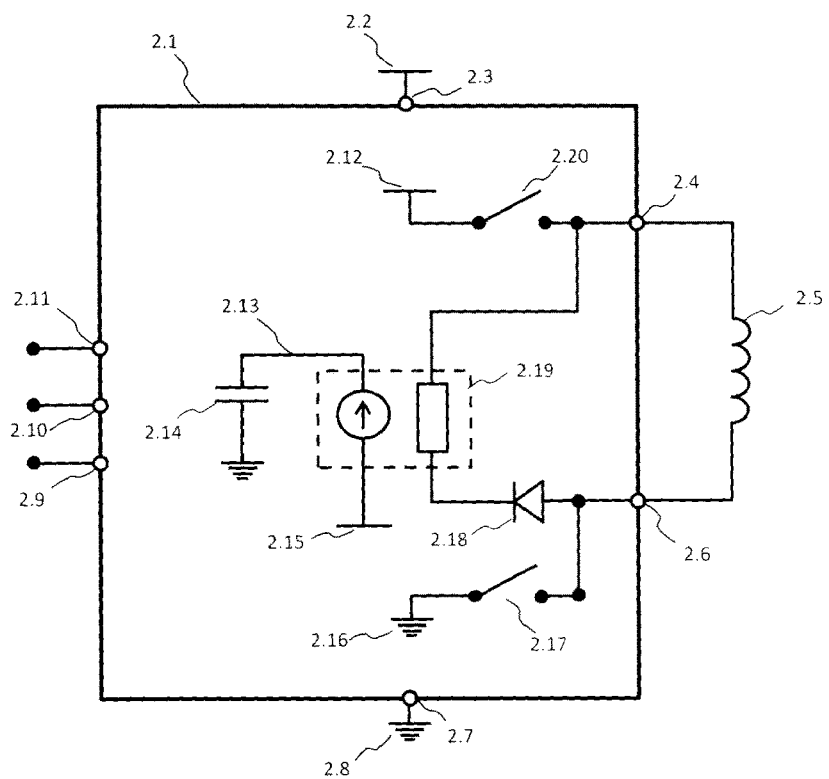
FIG. 2A shows an exemplary embodiment of a charge transfer based inductance measurement system which utilizes a current mirror to derive a charging current.

Another exemplary embodiment closely related to the above is presented in FIG. 2A. Reference numerals for FIG. 2A are mainly the same as for FIG. 1, i.e. the elements identified by reference numerals 2.2, 2.3, 2.4, 2.5, 2.6, 2.7, 2.8, 2.9, 2.10, 2.11, 2.12 and 2.16 of FIG. 2A are the equivalent to the elements identified by reference numerals 1.2, 1.3, 1.4, 1.5, 1.6, 1.7, 1.8, 1.9, 1.10, 1.11, 1.12 and 1.16 of FIG. 1A; and additionally FIG. 2A shows a ground 2.16. Therefore, for brevity's sake, only those references which are relevant will be discussed. Charge transfer based inductance measurement circuit 2.1 includes use of a current mirror structure 2.19 which may facilitate use of a derivative of the free-wheeling current through diode 2.18 to charge capacitor 2.14 via interconnect 2.13 when switches 2.17 and 2.20 are open during a second phase, wherein first and second phases may function as disclosed earlier. Current mirror 2.19 may be fed from circuit internal voltage bus 2.15. The operation of the apparatus in FIG. 2A is similar to that described for FIG. 1, where said circuit tracks for example the number of charge transfer counts, or time counts, or a voltage on capacitor 2.14 after a predetermined period. Naturally, the present invention is not limited to the use of a single current mirror to increase or reduce the amount of current used to charge an accumulation capacitor such as 2.14, based on said free-wheeling current, but may utilize any number of current mirrors or other relevant structures to implement said increase or reduction.

Figure 2B:
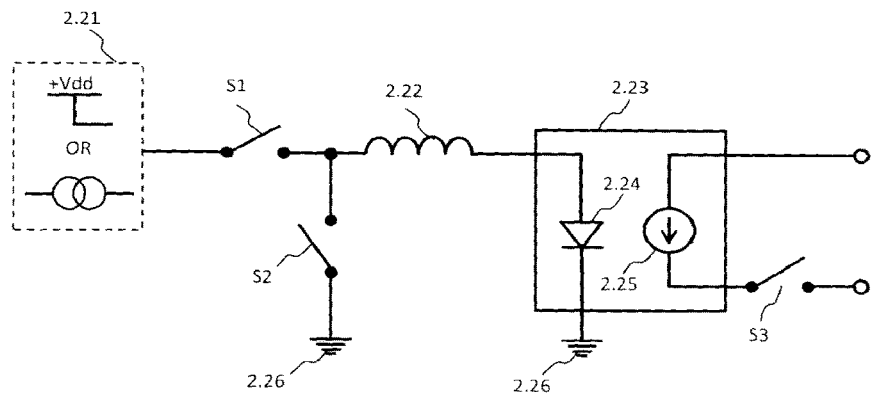
FIG. 2B shows an exemplary embodiment for the measurement of self-inductance with a current mirror structure used for charge transfer.
Figure 2C:
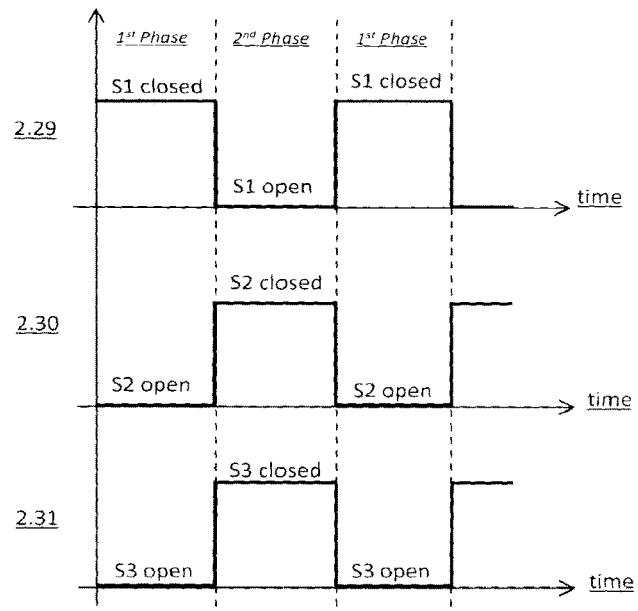
FIG. 2C shows exemplary switching signals for the embodiment of FIG. 2B.

In FIG. 2B, another exemplary embodiment of the present invention is shown which may be used to measure the self-inductance value of inductor 2.22 with, for example, a charge transfer apparatus and method. Inductor 2.22 may be connected to an energy source 2.21 via a controllable switch S1. Energy source 2.21 may be a voltage source or a current source, as illustrated. When inductor 2.22 is connected to said energy source, current should start to flow via said inductor, and via an input diode 2.24 of a current mirror structure 2.23 towards circuit ground 2.26, wherein the current will increase at a rate typically determined by the energy source and the value of said inductor. The voltage of the energy source 2.21 should be sufficient to forward bias diode 2.24, taking into account the voltage drop over inductor 2.22. According to the present invention, switch S1 is closed during a first phase for a predetermined period. During a second phase of the measurement process, switch S1 is opened and a second switch S2 is closed. Switch S2 may also be a diode. Closure of S2 may allow the current in inductor 2.22 to free-wheel. According to the present invention, a third switch S3 situated at the output of current mirror 2.23 may be closed simultaneously with S2, allowing a current to flow through the output of said current mirror during said second phase, wherein said output current is a scaled version of the current through inductor 2.22. FIG. 2C illustrates exemplary switch control waveforms for S1, S2 and S3 at 2.29, 2.30 and 2.31 respectively. As shown, the present invention teaches that in a preferred embodiment, little or no dead time exists between the closure of S2 and the opening of S1. Further, according to the present invention, when S2 is closed, the free-wheeling current through current mirror input diode 2.24 may result in a scaled current flowing via the current-source 2.25 at the output of the current mirror structure, with said scaling which may be dependent on the mirror ratio, as is known in the art. The current out of current mirror structure 2.23 may be used to transfer charge to an accumulation capacitor (not shown), as described earlier, and known in the art, wherein the number of repetitions of said first and second phases required to fill the accumulation capacitor to a predetermined level may be used as indication of the self-inductance value of inductor 2.22. Or, as disclosed earlier, the measurement process may be halted after a predetermined number of repetitions of the first and second phases, and the voltage over said accumulation capacitor may be taken as indication of said self-inductance value. The present invention teaches further that switch S3 need not be closed simultaneously with S2, or for that matter need not be present, to practice the invention. In the preferred exemplary embodiment shown, simultaneous closure of S3 and S2 is merely used to ensure that charge is only transferred to said accumulation capacitor when current in inductor 2.22 free-wheels, or decays, and not when it is increasing. Switch S3 also need not be limited to a single switch, but may be multiple switches at various locations in the current mirror structure or structures, or in the circuitry associated with said accumulation capacitor (not shown).

Figure 2D:
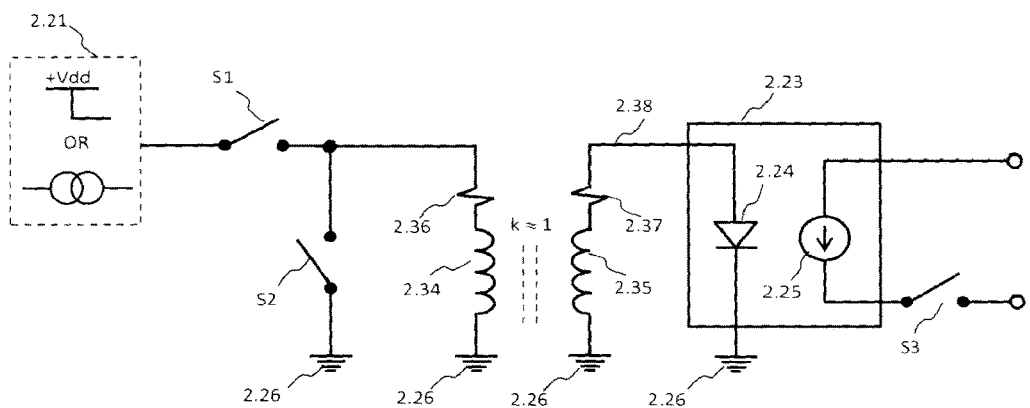
FIG. 2D shows an exemplary embodiment for the measurement of mutual inductance with a current mirror structure used for charge transfer.

The present invention teaches that a charge transfer measurement apparatus and method, as an example, may also be used to measure the mutual inductance for two magnetically coupled inductors. Other methods based on other prior art capacitive sensing methods and technologies, as discussed earlier, may also be used. An exemplary embodiment which may be used for such a mutual inductance measurement is presented in FIG. 2D. In large part, reference designators in FIG. 2B and FIG. 2D correspond, and have the same meaning. In FIG. 2D, a first inductor 2.34 is magnetically coupled to a second inductor 2.35. The first inductor may also be referred to as a transmitter or driver inductor, and the second inductor as a receiver inductor, akin to the terminology used for mutual capacitance sensing. For the example shown, the coupling factor k is high, and close to unity. First and second resistances 2.36 and 2.37 are in series with each inductor respectively, and represent the resistive losses of each inductor. Similar to before, inductor 2.34 may be connected to an energy source 2.21 via a first switch 51 during a first phase, and connected to ground 2.26 via a second switch S2, which may also be a diode, during a second phase, wherein the latter connection allows current in inductor 2.34 to free-wheel. Due to said magnetic coupling, a changing current in transmitter inductor 2.34 may result in a changing current in receiver inductor 2.35, and therefore also a voltage over inductor 2.35. If the voltage at input terminal 2.38 of current mirror 2.23 is higher than the forward biasing voltage required by input diode 2.24, current may flow via said diode, which may result in a scaled current in the output current source 2.25 of current mirror structure 2.23, as is known in the art. As before, a switch or switches S3 may or may not be used to enable or inhibit current flow at the output of said current mirror. According to the present invention, the current in receiver inductor 2.35, or a derivative thereof, for example the current in mirror output source 2.25, may be used to transfer charge to an accumulation capacitor (not shown), wherein the number or repetitions of said first and second phases, in other words the number of charge transfers, may be used as indication of the value of mutual inductance between transmitter inductor 2.34 and receiver inductor 2.35. Typically, the number of charge transfers to said accumulation capacitor (not shown) may be inversely proportional to the current in receiver inductor 2.35 and said coupling factor. Further, according to the present invention, a time count required for said accumulation capacitor (not shown) to be charged to a predetermined voltage may be used as indication of said mutual inductance. Alternatively, the process may be halted after a certain number of charge transfers, and the voltage over said accumulation capacitor (not shown) may be taken as indication of said mutual inductance. In yet another related embodiment of the present invention, the magnitude of the current flowing out of current mirror structure 2.23 via current source 2.25 may be used directly as an indication of said mutual inductance.

In a preferred embodiment, switch S3 and others in or associated with said current mirror structure or structures, wherein said switches which may be used to enable or inhibit current flow into said accumulation capacitor, are closed during each repetition of first and second phases of the measurement process, in other words said switches are permanently closed. In this manner, whenever the voltage at input terminal 2.38 is higher that the required forward biasing voltage of diode 2.24, the current in receiver inductor 2.35 may be multiplied by the mirror scaling ratio, and the resultant current may be integrated by said accumulation capacitor. As before, the number of repetitions of said first and second phases required to charge the accumulation capacitor to a predetermined level may be used as indication of said mutual inductance.

Figure 2E:
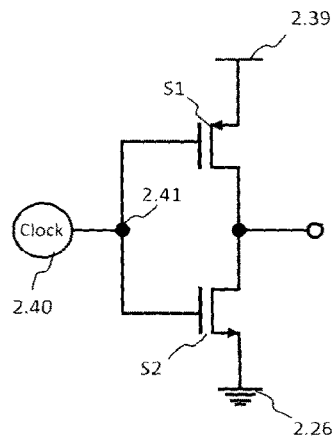
FIG. 2E shows an exemplary switching structure using MOSFET's.

FIG. 2E illustrates an exemplary implementation of switches S1 and S2 using a series connection of an N-type and a P-type MOSFET between a voltage bus 2.39 and ground 2.26. As illustrated, the gates of the two MOSFET's may be driven by a single clock source. When S1 is turned on, S2 is turned off, and vice versa. For example, for a semiconductor integrated embodiment which includes some logic or a processor and a clock source for said logic or processor, the clock source may be used to control S1 and S2, as shown by 2.40 and 2.41. This may be advantageous if a high rate of switching S1 and S2, due to a small self-inductance or mutual inductance being measured, is required. For example, processor clock speeds are often in the range of a few or tens of MHz, which may then be used to switch S1 and S2.

Figure 2F:
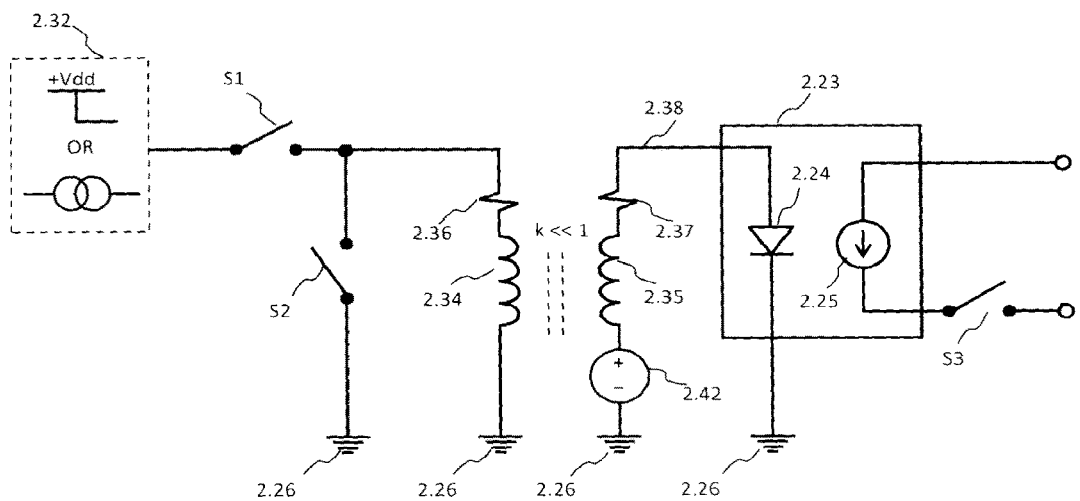
FIG. 2F shows a modified exemplary embodiment for the measurement of mutual inductance which facilitates small coupling factors.

If the coupling between the transmitter and receiver inductors is weak, with a coupling factor k significantly smaller than one, obtaining sufficient voltage across the receiver inductor to forward bias said input diode of the current mirror structure may prove challenging. An exemplary embodiment of the present invention which may be used to overcome this is shown in FIG. 2F. As before, reference designators for FIG. 2F correspond largely to those in FIGS. 2B and 2D, and have the same meaning. Additionally, FIG. 2F shows an energy source 2.32 which is similar to energy source 2.21. According to the present invention, by placing a voltage source 2.42 in series with receiver inductor 2.35, the above obstacle may be overcome. Preferably, voltage source 2.42 may be dimensioned such that its amplitude is just below the forward biasing voltage required for input diode 2.24, and it may be oriented so that it adds to the voltage developed across receiver inductor 2.35 when a changing current flows through it towards ground 2.26. In this manner, only a small amount of changing current through inductor 2.35 may be required to forward bias input diode 2.24, allowing current to flow into current mirror 2.23, which may then be used to transfer charge to an accumulation capacitor (not shown) to determine said mutual inductance, or said current may be used with another inductance measurement method. In a preferred embodiment, voltage source 2.42 may be implemented with an op-amp, and the solution may be integrated, although the invention is certainly not limited in this regard.

Figure 2G:
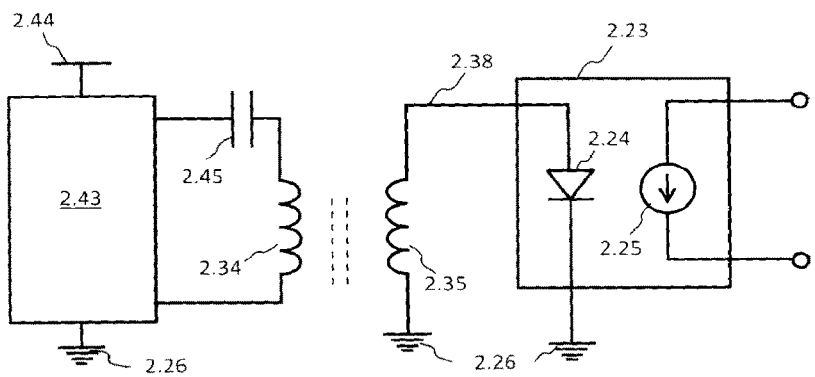
FIG. 2G shows an exemplary embodiment of a circuit for the measurement of small mutual inductances which utilizes a resonant circuit.

FIG. 2G presents another exemplary embodiment which may be used to ensure sufficient voltage at input terminal 2.38 of current mirror structure 2.23. This may be used for example if transmitter inductor 2.34 and receiver inductor 2.35 are small, for instance of the order of a few nH, or if the coupling between the two inductors is weak. As before, reference designators correspond in large part. A circuit 2.43, for example an H-bridge with four switches, as is known in the art, may be connected to a supply 2.44 and ground 2.26, and to a series combination of a capacitor 2.45 and a transmitter inductor 2.34. According to the present invention, circuit 2.43 may be used to energize capacitor 2.45 and inductor 2.34 at their resonant frequency, in order to place them in a resonant state. When resonance with said capacitor and inductor is achieved, a strong enough magnetic field may be emitted by transmitter inductor 2.34 to sufficiently couple to receiver inductor 2.35 to forward bias input diode 2.24 of current mirror 2.23, allowing measurement of mutual inductance in a manner similar to that described earlier, for example with a charge transfer measurement process as disclosed.

Figure 3A:
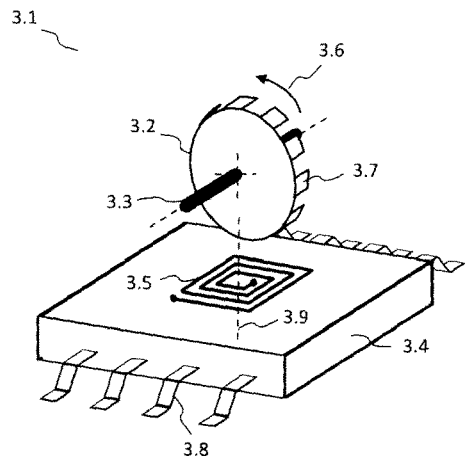
FIG. 3A to 3C show exemplary embodiments where the rotation of a metal wheel may be monitored via an integrated circuit which contains an on-chip inductor and a charge transfer based inductance measurement system.

As discussed previously, inductance sensing as disclosed may be used to monitor movement of a target, where said movement influences magnetic field lines emanating from said inductance. According to the present invention, if the inductance to be sensed or measured is an on-chip inductor, an IC may be realized for the measurement of wheel rotation, wherein said wheel comprises metal or another magnetic material, and typically, but not necessarily, in close proximity to the IC. FIG. 3A illustrates such an embodiment in an exemplary manner at 3.1. An IC 3.4 comprises an on-chip inductor 3.5 in addition to a charge transfer inductance measurement system (not shown) as disclosed earlier. The IC may also comprise other types of circuitry, e.g. processing circuitry, power control circuitry, communication circuitry and so forth. It is to be appreciated that said inductor 3.5 need not be constrained to realization on silicon, but may be implemented within the packaging via any of a number of alternatives, for example using the lead-frame of the IC. Integrated circuit 3.4 may have a number of leads or pins 3.8, to furnish connections for electrical power, communication, control and so forth. In the exemplary embodiment shown, a metal wheel 3.2 is situated in close proximity to IC 3.4, and ideally is close to the main axis 3.9 of the magnetic field for inductor 3.5. The wheel 3.2 rotates in direction 3.6 about an axle 3.3. Metal wheel 3.2 has a number of metal tabs 3.7 which are orthogonal to the surface of said wheel, for example. As the wheel rotates, metal tabs 3.7 should sweep pass inductor 3.5, and if designed correctly, may cause a measurable change in the inductance of inductor 3.5. Since each metal tab is followed by an absence of one, the inductance measured for inductor 3.5 with a charge transfer based measurement system, not shown, should be a periodic signal when wheel 3.2 rotates, with the period determined by the wheel speed of rotation. Therefore, according to the present invention, an embodiment as shown in FIG. 3 may be used to monitor for rotation and the speed thereof, using an on-chip inductor. Other methods to measure the inductance of inductor 3.5 may also be employed in the above. For example, methods based on other prior art capacitive sensing methods and technologies, as discussed earlier, may be employed.

Figures 3B, 3C:
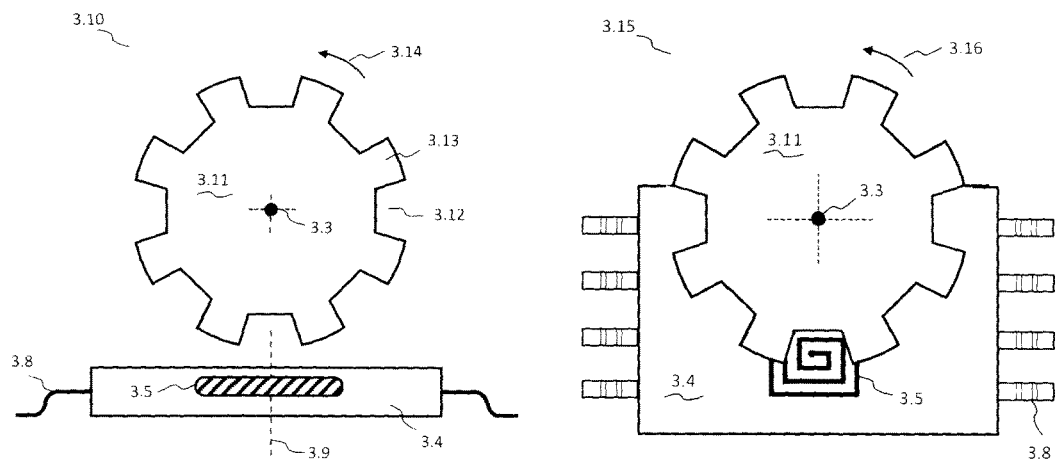

FIG. 3B and FIG. 3C illustrate two related exemplary embodiments at 3.10 and 3.15 respectively. In the former, metal wheel 3.11 is characterised by having metal tabs 3.13 in the same plane as wheel 3.11, that is, they are not orthogonal as in FIG. 3A. Spaces 3.12 exist between tabs 3.13, which should result in a periodic variation for the measured inductance of coil 3.5 as said wheel rotates in direction 3.14. At 3.15, wheel 3.11 is parallel to IC 3.4, as is evident from the top view presented. As the wheel rotates in direction 3.16, on-chip inductor 3.5 will be periodically covered by a metal tab, which may allow a charge transfer measurement system (not shown), to discern rotation of wheel 3.11 and the speed thereof.

Figure 4:
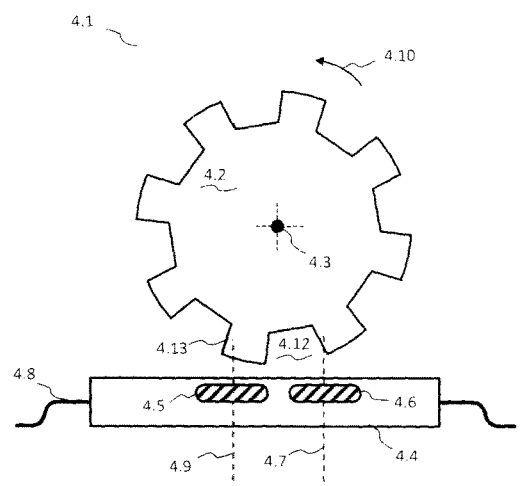
FIG. 4 shows an exemplary embodiment where two inductors are realized on-chip along with an integrated charge transfer measurement system, which may allow sensing of wheel rotation speed and direction.

However, one limitation of the embodiments shown in FIG. 3A to 3C is that it may typically only be practical to determine rotation speed, but not direction, from the resulting inductance signal, due to the symmetric nature of the metal tabs. FIG. 4 illustrates at 4.1 an alternative exemplary embodiment which may facilitate measurement of both the speed and direction of wheel rotation. In the embodiment shown, two inductors 4.5 and 4.6, as an example, are realized within the packaging of the IC 4.4, typically, but not necessarily, with magnetic field axes 4.9 and 4.7 parallel to each other. IC 4.4 may also have pins or connections 4.8 to furnish connections for, for example, electrical power, communications and control signals. In addition, IC 4.4 comprises charge transfer based inductance measurement circuitry, e.g., (not shown) as disclosed earlier. The IC may also contain other types of circuitry, such a processing circuitry, power control circuitry, communication circuitry and so forth. When a metal wheel 4.2, or another object manufactured from the one or other material which influences magnetic fields, rotates in direction 4.10, metal tab 4.13 is preceded by a gap or absence of a tab 4.12. If wheel 4.2 rotates in the reverse direction 4.10, tab 4.13 should be followed by gap 4.12. Therefore, from the resulting change in measured inductances for coils 4.5 and 4.6, it may be possible to determine both the speed and direction of wheel 4.2. The dimensioning of the tabs and gaps on said wheel may need to be done correctly to achieve optimal wheel rotation direction and speed detection. According to the present invention, said inductance may be measured with a charge transfer based method as disclosed earlier, or with another method. For example, methods based on other prior art capacitive sensing methods and technologies, as discussed earlier, may be employed.

Figure 5A:
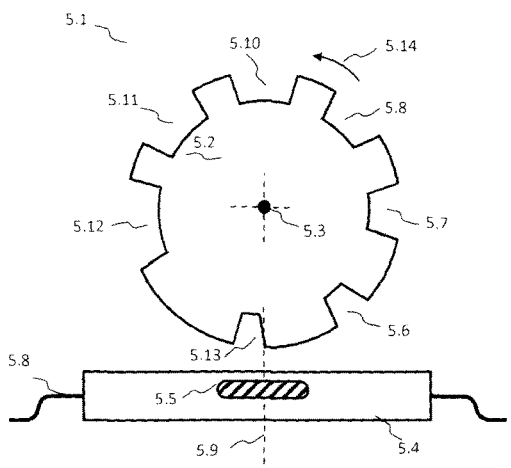
FIG. 5A to 5E show exemplary embodiments which may allow use of a single on-chip inductor to sense the rotation speed and/or direction of rotating wheels with specific designs.

FIG. 5A shows another exemplary embodiment at 5.1 where a single on-chip, or external, coil or inductor 5.5 may be measured with a charge transfer based measurement circuit, e.g., (not shown) to determine both the speed and direction of a metal wheel 5.2 which rotates in direction 5.14 about axis 5.3 above integrated circuit 5.4, where said measurement circuit is for example contained by said IC. The IC may also contain other types of circuitry, such a processing circuitry, power control circuitry, communication circuitry and so forth. In this exemplary embodiment, wheel 5.2 is coded around its periphery with a constantly changing gap width, and one abrupt step in gap width, as is evident. E.g. gap 5.13 is the most narrow, followed by gaps 5.6, 5.7, 5.8, 5.10, 5.11 and 5.12, with the latter having the largest width. As a result, the measured inductance signal for coil 5.5 may be used to calculate both the speed and direction of rotation for wheel 5.2, since a rotation in direction 5.14 should result in gap 5.13 being followed by 5.12, and rotation in the reverse direction should have gap 5.12 followed by gap 5.13. Naturally, wheel 5.2 need not be made of metal, but may consist, partially or wholly, of any material which influences magnetic fields. In the exemplary embodiment shown, reference 5.8 designates pins, leads or connections for IC 5.4, and 5.9 designates the main magnetic axis for coil 5.5. It stands to reason that said axis need not be aligned as illustrated to practice the teachings of the present invention, and that the illustration is only an example.

Figure 5B:
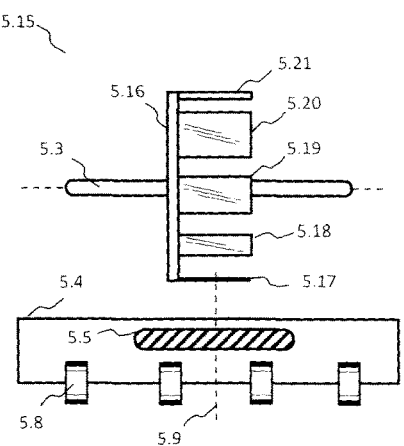

An exemplary embodiment closely related to FIG. 5A is shown in FIG. 5B at 5.15, with the main difference being the orientation of tabs 5.17 to 5.21 relative to wheel 5.16. As is evident, the tabs have decreasing or increasing width, dependent on the direction of rotation. For brevity's sake, further explanation is omitted, given the similarity with FIG. 5A.

Figure 5C:
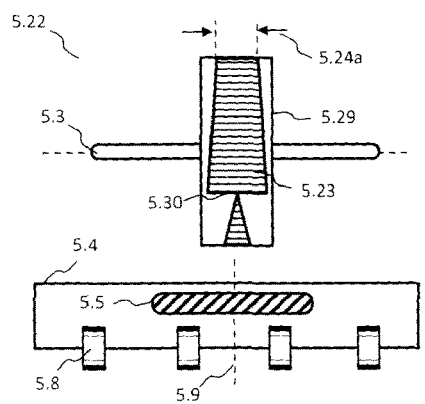
Figure 5D:
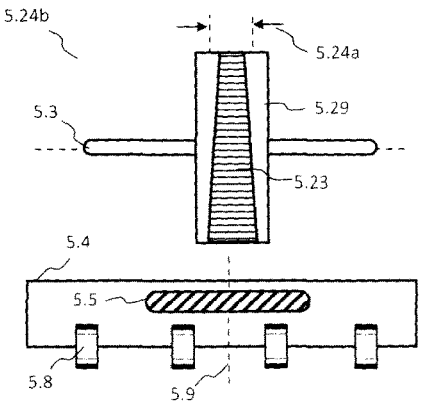

Yet another exemplary embodiment closely related to FIG. 5A and FIG. 5B is shown in FIG. 5C and FIG. 5D at 5.22 and 5.24*b* respectively, where the latter is just a view of the former where wheel 5.29 has been rotated by one hundred and eighty degrees. Wheel 5.29 has a band of metal 5.23 positioned all along its circumference, wherein the width 5.24*a* of said metal band decreases or increases continually, dependent on the direction of rotation, with a sudden step from a minimum width to a maximum, or from maximum width to minimum, at one point 5.30, as an example. As such, when wheel 5.29 is rotated, the amount of metal directly above on-chip coil 5.5 varies in a continuous fashion, with a sudden stepwise increase/decrease at a point 5.30. Consequently, the inductance of coil 5.5, as measured with a charge transfer measurement system as disclosed, or with another method, for example methods based on other prior art capacitive sensing methods and technologies, as discussed earlier, should also vary continuously as said wheel is rotated, with a stepwise increase/decrease in inductance at one point. From this measurement information, both the rotation speed and direction of wheel 5.29 may be calculated, according to the present invention. Wheel 5.29 may typically be manufactured out of plastic, or another relevant material, and metal band 5.23 may be in the format of a metal tape with adhesive properties which is stuck into a groove or similar in the wheel, as an exemplary application.

Figure 5E:
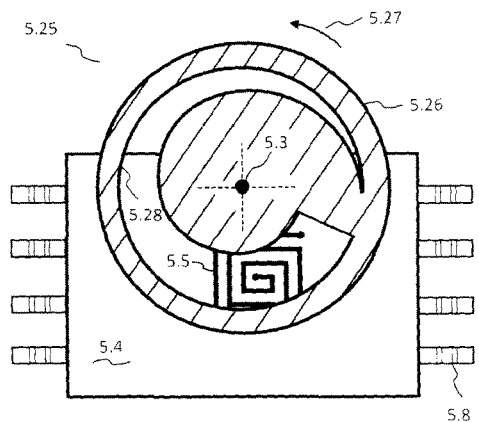

In FIG. 5E, yet another exemplary embodiment closely related to the embodiments shown in FIG. 5A to FIG. 5D is presented at 5.25. In this case, a metal wheel or disk 5.26 is positioned above IC 5.4 in a horizontal orientation, such that the face of said wheel is parallel to the upper face of said IC. An exemplary cut-out 5.28 exists in metal wheel or disk 5.26, wherein the width of the cut-out continually varies up to a sudden step in width. Consequently, as the wheel or disk 5.26 rotates in direction 5.27, or in the reverse direction, on-chip coil 5.5 is continually covered by a varying amount of metal, up to the step point. Given the similarity with the other embodiments in FIG. 5A to FIG. 5D, and for brevity's sake, the disclosure will not elaborate further on FIG. 5E, except to note that the invention is not limited to the embodiment shown. For example, cut-out 5.28 may be replaced with a metal strip of similar design and dimensions, but which is stuck onto the bottom face of a wheel manufactured from plastic, as opposed to the metal of wheel 5.26.

Figure 6A:
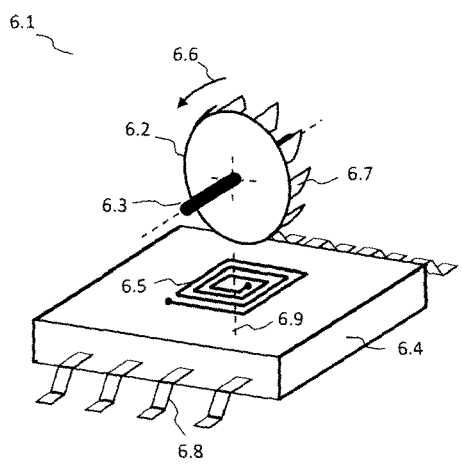
FIG. 6A to 6B show further exemplary embodiments which may allow use of a single on-chip inductor to sense the rotation speed and/or direction of a rotating wheel with a specific design.
Figure 6B:
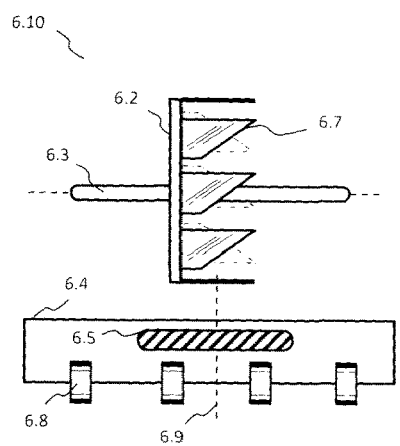

In FIG. 6A and FIG. 6B, exemplary embodiments closely related to that shown in FIG. 5 are presented at 6.1 (3D view) and 6.10 (side-view). A metal wheel 6.2 is positioned over and rotates in the direction of arrow 6.6 above an exemplary integrated circuit (IC) 6.4, wherein said IC contains an on-chip coil or inductor 6.5, with a primary magnetic axis 6.9, and a charge transfer based inductance measurement circuit, e.g., (not shown) connected to said coil. Other types of inductance measurement circuitry may also be used. For example, methods based on other prior art capacitive sensing methods and technologies, as discussed earlier, may be used. The integrated circuit 6.4 may also contain other types of circuitry, for example processing circuitry, power control circuitry, communication circuitry and so forth, and has leads, pins or connections 6.8 to facilitate transmission of electrical power, communication and control signals. Metal tabs 6.7 are characterised by e.g. their saw tooth shape, as is evident from the figure, and by being symmetrically spaced and uniformly dimensioned. Therefore, as wheel 6.2 rotates about axis 6.3, on-chip inductor or coil 6.5 should be alternately covered by a gap between tabs, and by a saw tooth shaped tab. As a metal tab moves over said inductor, the direction of wheel rotation will determine whether the metal increases or decreases during the movement, barring the sudden steps in the amount of metal over said inductor when the edges of the tab moves over the inductor. From the resulting measured inductance for coil 6.5, the IC, or another circuit, may calculate or determine both the speed and direction of wheel rotation, according to the present invention. It is to be appreciated that the present invention is not limited to a metal wheel, and that wheel 6.2 may for example consist partially or wholly of any relevant material which allows sufficient influence of the magnetic fields of inductor 6.5. Or only the tabs may be manufactured from a material which influences said magnetic fields. The invention is also not limited to saw tooth shape tabs, but any tab or shape which has a distinct characteristic in the direction of rotation may be used.

Figure 7A:
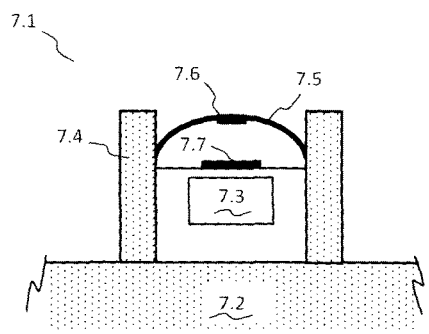
FIG. 7A to 7B show an exemplary embodiment of the invention in the form of a combination tactile switch and Hall-effect switch, and use thereof in a cover for underwater or highly explosive environment application.
Figure 7B:
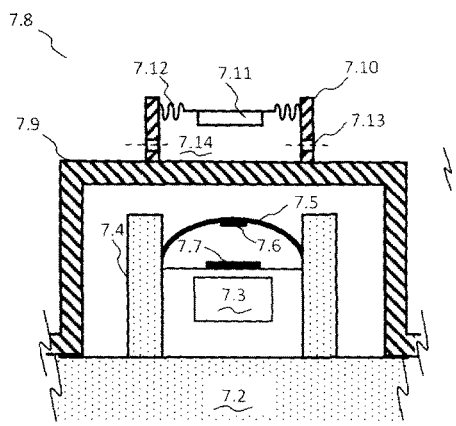

FIGS. 7A and 7B illustrates exemplary embodiments of the present invention which facilitate realization of improved switches. At 7.1 a typical tactile switch with a dome structure is presented, with the distinction that a Hall-effect sensor is also incorporated into the switch structure, for example. A hosting device 7.2 uses two pillars or a protrusion 7.4 to house a dome switch 7.5. Hosting device 7.2 monitors contacts 7.6 and 7.7 via monitoring circuitry and interconnects (not shown) to determine when dome 7.5 is depressed sufficiently to allow said contacts to be connected to each other. However, according to the present invention, a Hall-effect sensor 7.3 is also contained within the switch structure as shown, and is for example monitored by said hosting device via said monitoring circuitry and other interconnections (not shown), wherein said Hall-effect sensor can sense changes in magnetic fields, as is known in the art. Such an arrangement may provide a more secure switch. For example, a dedicated magnet may be used to depress dome 7.5, allowing the hosting device 7.2 to confirm that the dome switch was intentionally activated. Or the contacts 7.6 and 7.7 may be replaced with a single magnet, allowing a more sealable switch, since no electrical contact is required. Or the hosting device may only use the Hall-effect sensor to determine switch activation, even though said contacts are present.

Often, a need exists to place a hosting device, such as 7.2 into a liquid-proof or gas proof-cover (I.e. liquids or gas cannot leak into, or out of, said cover). For instance, presently action cameras sold by GoPro™ are very popular and often used underwater. This necessitates the use of waterproof covers for these cameras. However, to activate camera buttons through these covers, prior art solutions utilize structures where some part of the cover moves to depress said buttons. This increases the cost and complexity of sealing. According to the present invention, it may be possible to use a more rigid cover in conjunction with a switch as illustrated in FIG. 7A, which removes the need for said cover to depress said switch. An exemplary embodiment of this teaching is illustrated at 7.8 in FIG. 7B. The switch of FIG. 7A is for example covered with a rigid or semi-rigid cover 7.9, wherein the cover has a protrusion or structure 7.10 positioned over dome 7.5. Structure 7.10 allows an exemplary magnet 7.11 to be placed over dome 7.5 and thus also above Hall-effect sensor 7.3, wherein magnet 7.11 is supported by or suspended from resilient members 7.12, wherein said resilient members return the magnet to its original position after it has been moved, for example it has been depressed. Holes 7.13 exist in protrusions or structure 7.10 to allow liquid or gas pressure internal and external to volume 7.14 to equalize, as an exemplary method of pressure equalization. Therefore, the embodiment shown in FIG. 7B may allow a user to activate the switch underneath the rigid or semi-rigid cover 7.9 by depressing magnet 7.11 sufficiently to cause detection by Hall-effect sensor 7.3, wherein said sensor forms part of said switch. It is to be appreciated that the structure as illustrated is only exemplary, and that embodiments may include additional devices and structures to recreate a tactile feeling when magnet 7.11 is depressed. Due to the discussed equalization of liquid or gas pressure internal to and external to volume 7.14, an embodiment as shown in FIG. 7B should not be affected by water depth, or increases or decreases in gas pressure. As such, an embodiment as shown facilitates sealing of electronic devices with rigid or semi-rigid covers in a simple, cost-effective and secure manner.

As an alternative to the above, the present invention teaches that a tactile or dome switch, or another type of mechanical switch, may also comprise a coil integrated into the switch structure, or external to it, as examples, wherein the inductance of said coil is measured, for example with a charge transfer based measurement system as disclosed earlier, or another measurement system, and wherein said inductance measurements are either used to confirm signals from galvanic or electrical contacts that reflect switch activation or deactivation, or are used to discern switch activation or deactivation without the need for the make or break of galvanic or electrical connections. Inductance measurement methods based on other prior art capacitive sensing methods and technologies, as discussed earlier, may also be employed in the above. FIG. 8A to 8D illustrates exemplary embodiments related to the preceding teaching. At 8.1 in FIG. 8A a top view of e.g. a tactile or dome switch 8.2 hosted by a device 8.3 is shown with a coil or inductor 8.4 surrounding the tactile switch, and integrated into the structure of device 8.3. Changes in the measured inductance for coil 8.4, which may be measured with a charge transfer based measurement system as disclosed earlier, but need not be, may be used to confirm or negate detection of the activation or deactivation of switch 8.2, wherein said detection is based on signals from galvanic or electrical make or break contacts. For example, movement of metal within the magnetic field of inductor 8.4 may be used for said confirmation or negation. Or said movement of metal within the magnetic field of inductor 8.4 may be used to discern a switching action, without the need for make or break of electrical or galvanic contacts.

Figure 8A:
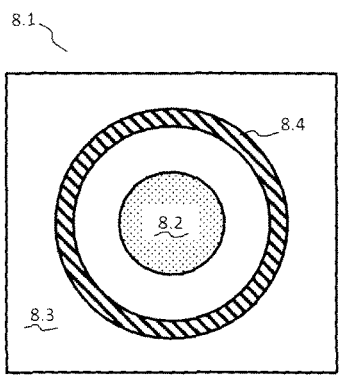
Figure 8B:
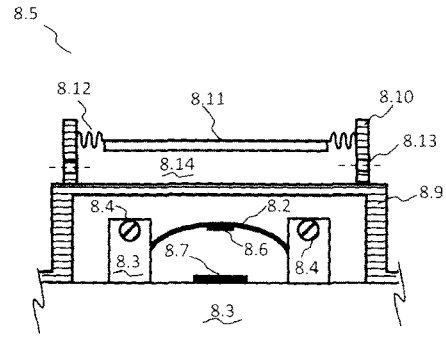

FIG. 8B shows a side view of an exemplary embodiment at 8.5, where a tactile or dome switch 8.2 is used e.g. with a coil 8.4 integrated into the structure of a hosting device 8.3, and wherein the switching structure is covered by a rigid or semi-rigid cover 8.9, which may be used for water- or gas-proofing. Dome switch 8.2 may comprise galvanic or electrical contacts 8.6 and 8.7 which may be monitored by hosting device 8.3 via interconnects (not shown) to discern when the switch is activated. The inductance of coil or inductor 8.4 may be measured with for example a charge transfer measurement system as disclosed earlier, but need not be, with other methods for inductance measurement which may be used. For example, methods based on other prior art capacitive sensing methods and technologies, as discussed earlier, may be employed. Similar to the embodiment in FIG. 7B, the rigid or semi-rigid cover 8.9 in FIG. 8B comprise for example a protrusion or structure 8.10 which allows a metal plate 8.11 to be located over dome switch 8.2 and coil 8.4. Again, structure 8.10 has exemplary holes 8.13 to allow pressure internal and external to volume 8.14 to equalize. The metal plate 8.11 is suspended or supported by resilient members 8.12, with said members returning the plate to its original position after it has been forcibly moved. According to the present invention, if a user wants to interface with the switch through the rigid or semi-rigid cover 8.9, he or she may depress metal plate 8.11 until is sufficiently close to and over coil 8.4 for the inductance measurement system to detect a change securely. As before, the embodiment illustrated is not limitative, and additional details may be realized to facilitate a tactile or click feeling when metal plate 8.11 is depressed beyond a certain point. The embodiment shown in FIG. 8B may work well to realize cost-effective liquid- or gas-proof covers for electronic devices which require user interfacing with buttons when the devices are enclosed within said covers. For example, in highly explosive environments, electronic devices need to be sealed, to prevent explosions due to switch arcing.

A side-view of another related exemplary embodiment is shown at 8.15 in FIG. 8C. A printed circuit board (PCB) 8.17 is located within the outer housing of a hosting device 8.3, with a pushbutton 8.16 protruding through said housing. Said pushbutton 8.16 has a post 8.18 for example which lies underneath a flexible membrane 8.2, and wherein a user may depress the membrane, which will in turn depress post 8.18 to activate pushbutton 8.16. PCB 8.17 is characterised by an exemplary coil or inductor 8.4 located around or in the vicinity of switch 8.16, wherein connections (not shown) to the coil and to the switch are monitored by the same circuitry (not shown). According to the present invention, the inductance of the coil may be measured with a charge transfer based measurement circuit, which may be integrated, although other circuits may certainly also be used to measure said inductance. For example, circuits which employ methods based on other prior art capacitive sensing methods and technologies, as discussed earlier, may be used. Further, according to the present invention, changes in said measured inductance may be used by said monitoring circuitry to annunciate e.g., a state change for switch 8.16. The changes may be used for example in conjunction with information on the state of electrical or galvanic contacts within switch 8.16, or they may be used on their own. That is, according to the present invention, said monitoring circuitry may decide whether to communicate an activation or deactivation signal for switch 8.16 based only on measured changes in the inductance of coil 8.4, or based on the combination of said measured changes and measured changes in the status of electrical or galvanic contacts of the switch. Typically, when a piece of metal, or other material which influences magnetic fields, is brought sufficiently close to coil 8.4, the inductance of the coil may change measurably.

Application of a switch embodiment as illustrated in FIG. 8C with a rigid or semi-rigid liquid- and/or gas-proof cover 8.9 is shown in exemplary manner by FIG. 8D at 8.21 in a side-view. In this embodiment, cover 8.9 overlies the housing of the hosting device 8.3 and membrane 8.2, and does not move in any substantially way. Of course, embodiments may also exist where cover 8.9 does move sufficiently to depress membrane 8.2. For example, cover 8.9 may depress switch 8.16 halfway, which may be detected by monitoring circuitry of device 8.3 and taken as an indication that said cover is in place. A structure 8.22 is placed over the protrusion that covers 8.9 forms over the switch. Structure 8.22 may for example be in the form of a circular disk or puck with a hollow interior, although it is certainly not limited to this shape. A metal disk or plate 8.11, typically also circular with a concentric hole is located on the bottom face of structure 8.22. Naturally, plate 8.11 is not limited to the shape described and shown. A resilient, spring-like structure 8.19 from metal or plastic, as exemplary materials, is situated between structure 8.22 and cover 8.9, and returns said structure to its original position after it has been forcibly moved. When a user wants to activate switch 8.16 through liquid- and/or gas-proof cover 8.9, he or she may depress structure 8.22 in the direction of arrow 8.20, bringing metal disk 8.11 closer to the coil 8.4 on PCB 8.17. This should result for example in a measurable change in inductance measured for the coil, which monitoring circuitry (not shown) may use to annunciate a switch activation or deactivation, as discussed earlier. Importantly, structure 8.22 is open ended, meaning liquid or gas pressure on its outer and inner surfaces may equalize. This may allow the advantageous use of an embodiment as shown in FIG. 8D in for example diving lights, or in covers for cameras used for diving, since an increase in water pressure with depth will not result in activation of switch 8.16. Further, the present invention teaches that a number of methods and structures may be used by monitoring circuitry of a hosting device to detect when a cover as disclosed is in place, and only utilize inductance measurement circuitry, or other circuitry or functionality, after said detection, as an example.

The present invention teaches that more than one coil or inductor may be utilized in the preceding embodiments, which may allow detection of the rotation of a metal structure external to said rigid or semi-rigid cover. For example, a metal wheel may be located on the external face of said cover, and impervious to changes in liquid or gas pressure, and wherein said wheel has distinct dimensional patterns over its circumference. By using two coils or inductors in a hosting device located within said cover, said coils being in close proximity to a tactile or dome switch, or another switch, rotation of said wheel underwater by a user, as a switch activation motion, may be detected through said cover, in a manner similar to that disclosed earlier.

According to the present invention, a plurality of Hall-effect sensors may be used in proximity to a tactile or dome switch to facilitate improved switches, or the realization of a rigid or semi-rigid cover for an underwater camera, as an example, wherein said cover allows switch activation without the requirement for cover movement in order to depress said switch. FIG. 9A to 9C illustrates exemplary embodiments of this teaching. In FIG. 9A at 9.1 a tactile or dome switch 9.2 is hosted by a device 9.3, and two Hall-effect sensors 9.4 and 9.5 are situated alongside said switch, as an example. As before, changes in the magnetic field sensed by Hall-effect sensors 9.4 and 9.5 may be used by monitoring circuitry (not shown) within device 9.3 or external to it, to determine when an activation or deactivation of the switch needs to be declared. For brevity's sake, this will not be elaborated on further. At 9.10 in FIG. 9B an exemplary embodiment with a liquid- and/or gas-proof cover 9.9 placed over the switch assembly of FIG. 9A is shown. Switch 9.2 comprises electrical or galvanic contacts 9.6 and 9.7, which may normally be used for switch activation/deactivation. However, since cover 9.9 is rigid or semi-rigid, it is typically not used to depress switch 9.2. Embodiments may exist where said cover is used to depress switch 9.2, however. A permanent magnet 9.11 is located on an external face of cover 9.9 within a swivel joint 9.12. This may facilitate user activation or deactivation of the switch assembly by moving or flipping magnet 9.11 from one position to the other, with Hall-effect sensors 9.4 and 9.5 detecting the associated change in measured magnetic fields, and communicating said change to monitoring circuitry (not shown) of device 9.3. This may allow the realization of a cover for an underwater camera, as an example, without any movement required of the cover surface to activate a switch of said camera.

Another related exemplary embodiment is depicted in FIG. 9C at 9.13, which is similar to FIG. 9B, with the difference that an exemplary permanent magnet 9.15 is contained within for example a horizontal wheel 9.14 which rotates on an axle 9.16 above rigid or semi-rigid cover 9.9. Therefore, according to the present invention, a user may activate or deactivate switch 9.2 through cover 9.9 by turning wheel 9.14 a certain amount, and wherein the resulting change in magnetic fields may be detected with Hall-effect sensors 9.4 and 9.5 and communicated to for example monitoring circuitry (not shown) of hosting device 9.3. It should be noted that the present invention is not limited to only two Hall-effect sensors as depicted in FIG. 9A to 9C, but any relevant number of sensors may be used. Further, the present invention includes the use of the one or other latching, or a similar mechanism, to give a tactile or click feeling to a user when he or she interfaces with the embodiments shown in FIGS. 8A, 8B, 8C, 8D and 9A to 9C.

According to the present invention, it may be advantageous to integrate the previously discussed coil or inductor into a moving part of a switch or button, wherein inductance measurements for said coil may be used, for example, to determine switch activation or deactivation, while possibly also using information from galvanic or electrical contacts which may be associated with said switch. When said coil is integrated into a moving part, it may become possible to only utilize inductance measurements for switch activation or deactivation determination when said part has moved past a physical threshold. FIG. 10A illustrates an exemplary embodiment of this teaching at 10.1. A hosting device 10.8 comprise a switch, which may be a traditional tactile or dome switch using electrical or galvanic contacts, for example, wherein a moving part 10.2 of said switch protrudes through a housing of the hosting device 10.8 underneath a flexible member 10.3. In accordance with the above teaching, a coil or inductor 10.4 is integrated into exemplary part 10.2, wherein the coil is connected via exemplary interconnects 10.10 and 10.11 to pads 10.9 and 10.13. When moving part 10.2 is in a certain position, pads 10.9 and 10.13 make contact with pads 10.7 and 10.12 respectively, wherein pads 10.7 and 10.12 are connected via exemplary interconnects 10.5 and 10.6 respectively to monitoring circuitry (not shown) of hosting device 10.8. In this manner, inductance measurements of coil 10.4 only becomes available once said pads make contact, where after said monitoring circuitry may use said measurements to determine switch activation status in the manner disclosed earlier. That is, inductance measurements for coil 10.4 can only be used by said monitoring circuitry (not shown) when moving part 10.2 has moved sufficiently to allow pads 10.9 and 10.13 to respectively make contact with 10.7 and 10.12. The inductance measurements may for example be made with a charge transfer based inductance measurement circuit as disclosed, which may be integrated, and which may be incorporated into device 10.8 or external to it. Or another type of inductance measurement circuit may be used. For example, inductance measurement based on other prior art capacitive sensing methods and technologies, as discussed earlier, may be employed.

FIG. 10B shows an exemplary embodiment at 10.16 which is closely related to that of FIG. 10A, with the difference that an exemplary PCB 10.14 is located within device 10.8, and pads 10.7 and 10.12 are located on the PCB, along with a dome structure 10.15 to give a tactile or click feeling to a user when flexible member 10.3, and thereby also moving part 10.2, is depressed sufficiently. Due to the similarity of FIG. 10B with 10A, further description of it will be omitted, for brevity's sake. In the embodiments of FIGS. 10A and 10B, use of coil 10.4 is also exemplary, and they may be replaced with Hall-effect sensors, as discussed earlier. Hall-effect sensors may provide a more accurate indication than coil 10.4 when a magnet, or another object, approaches moving part 10.2. However, this must be offset against the increase in complexity due to more than just two connections required for a typical Hall-effect sensor. For example, a Hall-effect sensor may require connections for power, ground, data communication and control.

FIG. 11A shows a top view of an exemplary double action dome switch which embodies the present invention at 11.1. A dome structure comprises a dome part 11.5 and two legs 11.3, for example, wherein the legs typically support the dome part. The dome structure is situated above a hosting device 11.2, wherein a conductive coil 11.6 is located within or on said hosting device, for example. An exemplary metal member 11.4 is attached to dome 11.5, typically to the underside of the dome. The member may also be formed from any other material which may influence or interact with the magnetic field of coil 11.6. To clarify the operation of the double action dome switch, a side-view is presented at 11.7 in FIG. 11 B. This view also shows an exemplary measurement circuit, typically an IC, 11.10 which measure the inductance of coil 11.6 with e.g. a charge transfer based method as described earlier in the present disclosure.

Another inductance measurement may also be used, for example a method based on other prior art capacitive sensing methods and technologies, as discussed earlier. In FIG. 11 B, the composition of said dome structure is more apparent, with dome 11.5 supported by legs 11.3, and metal member 11.4 attached to dome 11.5. When no pressure is applied to the dome structure, it is in an exemplary first nominal position with metal member 11.4 at a height 11.11 above coil 11.6. However, when a user applies a first amount of pressure to the dome structure, it may deform by bending exemplary legs 11.3, as shown at 11.14 in FIG. 11C, with metal member 11.4 now at a height 11.12. The dome structure is now in an exemplary second deformed position. This may change or affect the inductance of coil 11.6, which may be measured by circuit 11.10, where-after it may for example annunciate or communicate a detection of a first switching action, dependent on certain parameters, for example the amount of change in inductance, the time period over which change occurred and so forth. The detection and annunciation of a first switching action may also be performed by a circuit other than circuit 11.10, based on values measured by circuit 11.10.

When a user applies a second amount of pressure which is more than said first amount, and which exceeds a predetermined or certain threshold value, the dome part 11.5 of the structure may for example collapse, as shown at 11.15 in FIG. 11D. The dome structure is now in an exemplary third snap-through position. Said collapse may typically occur suddenly in a snap-through event, as is well known in the art. As shown, this results in metal member 11.4 being at a height 11.13 above coil 11.6, which may cause a further change in the inductance measured by circuit 11.10 for the coil. Consequently, circuit 11.10, or another circuit, may detect and annunciate or communicate a second switching action, dependent on certain parameters.

In FIG. 11A to 11D, member metal 11.4 may for example also be a permanent magnet, and circuit 11.10 may contain e.g. a Hall plate sensor to detect changes in magnetic field intensity as the dome structure changes between said first nominal, second deformed and third snap-through positions due to applied pressure. Naturally, coil 11.6 may be omitted in this case.

The exemplary double action switch embodiment depicted in FIG. 11A to 11D lends itself to applications which require sealing against liquid or gas ingress, since the coil 11.6 and measurement circuit 11.10 may be located within a sealed housing of device 11.2, and the dome structure and metal member may be external to said housing. The dome structure may be an open structure, to allow liquid or gas pressure to equalize around it and the metal member may be encased in for example plastic to prevent corrosion, without affecting the described operation of the switch.

In FIG. 12 yet another exemplary embodiment of the present invention is presented at 12.1. A circuit 12.2 may be located within a device 12.8, and said circuit may energize a driver coil 12.3 in a manner which causes e.g. pulses of current to flow through said coil, as symbolized by arrow 12.4. Said pulses may e.g. be of a constant amplitude, width and frequency, or they may be formed according to the one or other recognisable pattern, wherein said pattern may also contain modulated data. As a result of exemplary driver coil 12.3 being energized, magnetic field lines 12.5 may emanate from the coil. It should be noted that the magnetic field lines are only drawn in a qualitative manner, and should not be taken to be quantitative or exact. Magnetic field lines 12.5 may consequently couple into an exemplary receiver coil 12.6. Circuit 12.2 may e.g. also comprise charge transfer based inductance sensing circuitry, as has been disclosed earlier. Or it may comprise circuitry which employs an inductance measurement method based on other prior art capacitive sensing methods and technologies, as discussed earlier. Therefore, it may measure the inductance of receiver coil 12.6, with the measurement symbolized by line 12.7. When the magnetic field lines 12.5 is perturbed, circuit 12.2 may measure a change in inductance, or in other words a change in the number of charge transfer counts measured for each pulse, for example. This may be used for example to detect or measure movement of an object in proximity to driver coil 12.3, wherein said object has sufficient magnetic permeability to cause measurable perturbation of magnetic field lines 12.5 when it moves. According to the invention, the above exemplary embodiment may be used in a large number of user interfaces for electronic products.

Figure 13:
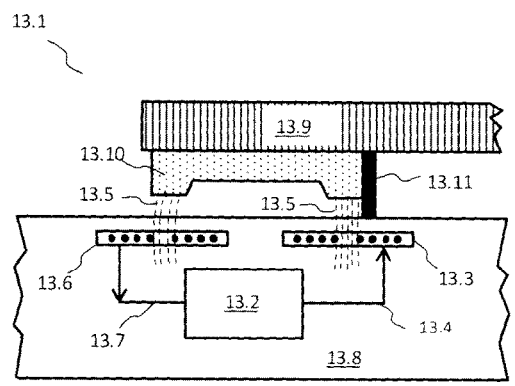
FIG. 13 shows an exemplary embodiment in the form of a rotary switch which utilizes a magnetic member to couple field from a driver coil into a receiver coil.

FIG. 13 illustrates such a user interface in exemplary manner at 13.1 in the form of a rotating switch. The switch may comprise a member 13.9 which may e.g. rotate about an axis 13.11, said axis positioned on an outer surface of a device 13.8. An exemplary magnetic coupling member 13.10, with relatively good magnetic permeability, is attached to rotating member 13.9 in such a manner that it may couple magnetic fields 13.5 from driver coil 13.3 effectively into a receiver coil 13.6 when rotating member 13.9 is in a first exemplary position. The driver coil may e.g. be energized by circuit 13.2 with pulses of current, as symbolized with arrow 13.4. When rotating member 13.9 is in said first position, corresponding pulses may be measured by circuit 13.2 in the inductance of receiver coil 13.6, the measurement symbolized by line 13.7, and wherein circuit 13.2 may for example measure the inductance of the receiver coil 13.6 using a charge transfer method and circuitry as disclosed earlier. Or circuit 13.2 may utilize an inductance measurement method based on other prior art capacitive sensing methods and technologies, as discussed earlier. When a user rotates member 13.9 of said rotating switch into a second exemplary position, characterized by the positioning of coupling member 13.10 such that it does not effectively couple the magnetic field of the driver coil into the receiver coil, circuit 13.2 may measure a substantial change in the number of charge transfer counts for receiver coil 13.6, which may be used to detect and annunciate rotation of said switch.

Figures 14A, 14B:
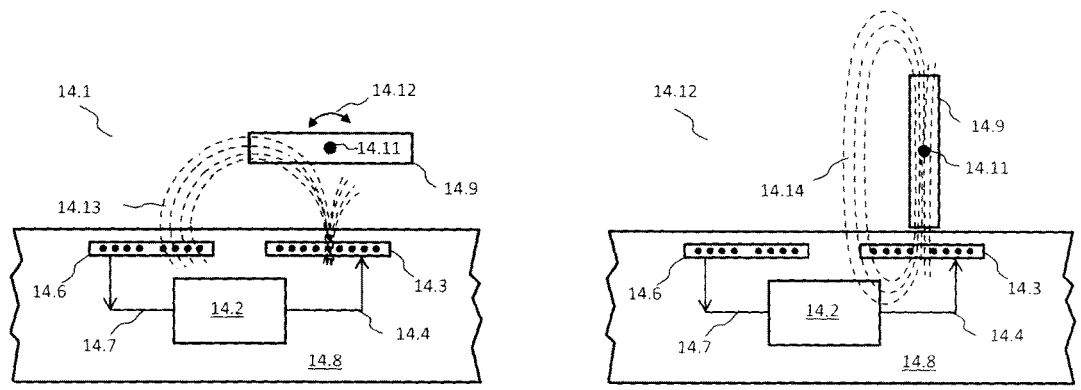
FIG. 14A to 14B show an exemplary embodiment in the form of a switch which utilizes a magnetic coupling member that rotates between a horizontal and a vertical position, resulting in magnetic field from a driver coil substantially coupling into a receiver coil, or not.

FIGS. 14A and 14B illustrate in exemplary manner an embodiment which may be used in a user interface device such as a switch. Reference numerals correspond in large part to that used in FIGS. 12 and 13, including reference numerals 14.4, 14.7 and 14.8 of FIGS. 14A and 14B which correspond with reference numerals 13.4, 13.7 and 13.8 of FIG. 13, respectively, and therefore the reference numerals of FIGS. 14A and 14B will only be elaborated on or referenced to where required, for brevity's sake. In the embodiment depicted, a user may rotate a member 14.9, or the one or other structure attached to it, about an axis 14.11, as shown by 14.12. Nominally, member 14.9 is in one of two positions, a horizontal position as shown in FIG. 14A, or a vertical position as shown in FIG. 14B, as example positions. According to the invention, member 14.9 may be formed out of e.g. a material with relatively high magnetic permeability, allowing it to guide or channel magnetic fields. As such, when member 14.9 is in a horizontal position, it may guide magnetic field lines 14.13 from driver coil 14.3 to substantially couple into receiver coil 14.6, as shown in FIG. 14A.

However, when member 14.9 is in a vertical position, magnetic field lines 14.14 from driver coil 14.3 is aligned along the length of said member, and may for example be substantially guided away from receiver coil 14.6, as shown in FIG. 14B. This may be measured by circuit 14.2 as a substantial change in charge transfer counts, and used to detect and annunciate the rotation of member 14.9, or a structure attached to it, from a horizontal to a vertical position. Circuit 14.2 may also employ an inductance measurement method based on other prior art capacitive sensing methods and technologies, as discussed earlier. It should be noted that magnetic field lines are once again depicted in a qualitative manner in FIGS. 14A and 14B, and should not be interpreted to be quantitative or exact. What is paramount is that a member with relatively high magnetic permeability may be rotated from a horizontal to a vertical position, or vice versa, or anywhere in between, and thereby cause a substantial change in the amount of magnetic field coupling from a driver coil into a receiver coil, which may result in a corresponding substantial change in the number of charge transfers measured for the receiver coil, and wherein said change may be used in a user interface to detect events.

Figure 15:
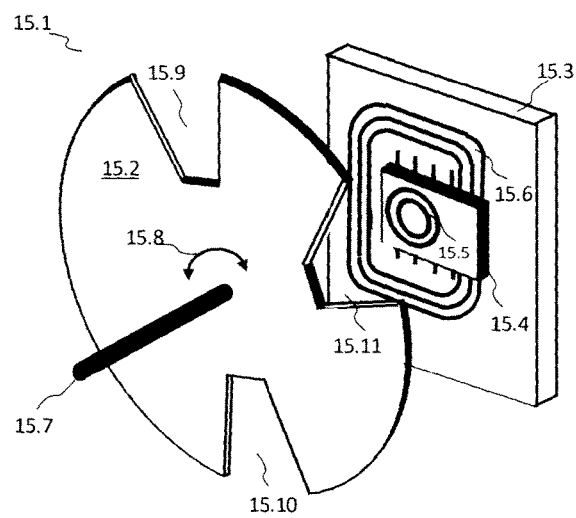
FIG. 15 shows an exemplary embodiment in the form of a speed and direction sensor for a rotating aluminium or copper wheel, wherein a driver coil is realized on-chip, and a co-centric receiver coil is located on a PCB.

According to the present invention, charge transfer based inductance measurements as disclosed may also be used with co-centric driver and receiver coils to detect proximity or movement of metal members. FIG. 15 shows an exemplary embodiment of this teaching at 15.1. A wheel 15.2 from metal, for example aluminium, rotates about an axis 15.7 in direction 15.8, wherein said wheel is in close proximity to a substrate 15.3, which may be a PCB, for example. Wheel 15.2 have a number of exemplary notches or gaps 15.9, 15.10 and 15.11 in its periphery, wherein said notches or gaps are unevenly spread about the wheel circumference, as shown. An IC 15.4 may e.g. be located on said substrate and may comprise charge transfer based inductance measurement circuitry as disclosed. Further, a driver coil 15.5 may be integrated into the IC semiconductor material or packaging, and may be co-centric to a receiver coil 15.6 located on substrate 15.3. That is, the driver coil 15.5 within IC 15.4 share a magnetic axis with receiver coil 15.6, and magnetic flux emanating from the former may couple with the latter. However, this coupling may be greatly reduced when for example a metal member is in close proximity to the IC and driver coil, due to losses caused by eddy currents induced in said metal member. Accordingly, when wheel 15.2 is oriented such that metal lies over, is in line with or covers driver coil 15.5, coupling between the driver coil and receiver coil may typically be minimal. When wheel 15.2 is oriented such that a notch or gap lies over or is in line with said driver coil, in other words, less or no metal is present directly over the driver coil, good coupling may be obtained between said driver coil and receiver coil 15.6. Consequently, according to the present invention, IC 15.4 may for example energize driver coil 15.5 with pulses according to the one or other predetermined pattern, and these pulses may be coupled effectively to receiver coil 15.6 whenever wheel 15.2 is oriented such that a notch or gap lies over or is in line with the driver coil. A charge transfer based inductance measurement circuit as disclosed may be located within IC 15.4 and used to count or note said pulses coupled into receiver coil 15.6, and from periods between consecutive pulses, the rotation speed and direction for the wheel may be calculated. IC 15.4 may also employ an inductance measurement method based on other prior art capacitive sensing methods and technologies, as discussed earlier. The exemplary uneven spread of notches or gaps along the circumference of said wheel may assist in determining rotation direction. An embodiment as shown may find good application in for example the monitoring of mouse scroll wheel rotation, but it certainly not limited to this. Further, the present invention should not be limited to the embodiment shown. For example, wheel 15.2 may consist of a material like plastic, but with a film of copper stuck to or deposited on the side facing the IC. Or both the driver and receiver coils may be located on substrate 15.3, or within IC 15.4. Or the wheel may be placed in an orientation which differs by ninety degrees from that shown, with the wheel edge facing the IC and said coils, and wherein said edge varies continually in width with a sudden step at one point, similar to that shown in FIG. 5C and FIG. 5D. Or an embodiment as depicted in FIG. 15 may employ an inductance measurement method based on other prior art capacitive sensing methods and technologies, as discussed earlier.

Figure 16A:
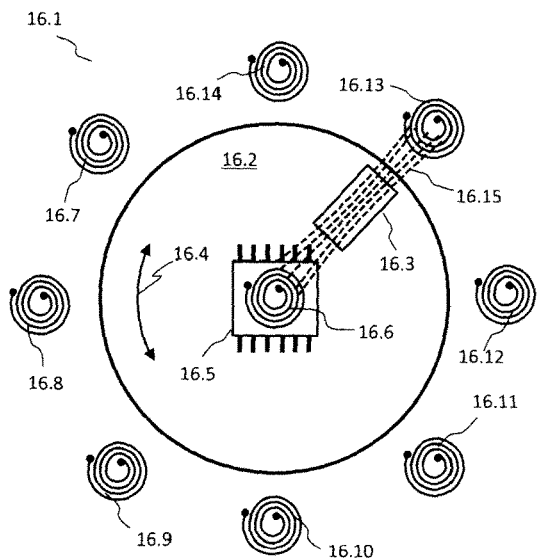
FIGS. 16A and 16B show an exemplary embodiment in the form of a waterproof rotary selector switch which utilizes a plurality of driver coils around a single receiver coil and a coupling member.
Figure 16B:
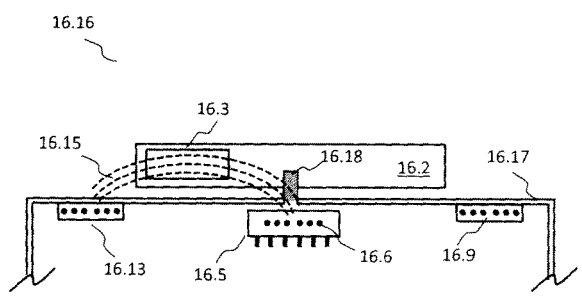

A rotary switch structure which comprises a number of driver coils that surround a central receiver coil, and which may be completely sealed against liquid or gas ingress may be realized according to the present invention, as depicted in exemplary manner in FIGS. 16A and 16B. As shown in a top view at 16.1, an exemplary disk 16.2 may rotate in a direction 16.4 and contain a coupling member 16.3 which may e.g. have good relative magnetic permeability, whereas disk 16.2 is fashioned out of a material with substantially lower relative magnetic permeability than said coupling member. An IC 16.5 may be located e.g. underneath said disk, and contain a receiver coil 16.6, wherein the latter is integrated in the semiconductor material or realized in another manner within the IC packaging. The receiver coil need not be contained within an IC, and may also be realised on a substrate such as a PCB, with an associated measurement IC at another location. IC 16.5 may employ charge transfer based inductance measurement as disclosed to measure the inductance of receiver coil 16.6. It may also employ another inductance measurement method or technology, for example one which is based on other prior art capacitive sensing technologies and methods, as discussed earlier. A number of exemplary driver coils 16.7 to 16.14 are arranged in the one or other pattern around said receiver coil. To determine the position or orientation of disk 16.2, IC 16.5 may sequentially energize each of said driver coils via e.g. interconnections (not shown), and measure the inductance of said receiver coil. Another pattern of driver coil energization may also be used. When disk 16.2 is orientated such that coupling member 16.3 is for example located between a particular driver coil and said receiver coil, magnetic field lines 16.15 may be coupled from said driver to the receiver coil. For example, in FIG. 16A coupling member 16.3 is located between driver coil 16.13 and receiver coil 16.6. It should be noted that magnetic field lines 16.15 is only drawn in part, and qualitatively rather than quantitatively. Due to the coupling between the particular driver and the receiver coil, IC 16.5, or another circuit, should detect a substantial difference in the inductance measured for said receiver coil when the particular driver coil is energized compared to what is measured when the remaining driver coils are energized. This may allow IC 16.5, or another circuit, to determine the position of the coupling member, and thereby also of disk 16.2, for example.

An exemplary embodiment as described above may be advantageously used to realize switches for use in e.g. electronic devices which need to be sealed against liquid and gas ingress. FIG. 16B provides a side-view at 16.16 of the embodiment in FIG. 16A, used with a product enclosure 16.17, wherein said exemplary enclosure may be used to seal an electronic device against liquid and gas ingress. Like numerals refer to like members in FIGS. 16A and 16B. As illustrated, disk or wheel 16.2 containing magnetic coupling member 16.3 is located on one side of said housing, and the driver coils and the IC are located on the other. A protrusion 16.18 may for example be formed in said housing, allowing disk or wheel 16.2 to rotate about it.

As another example, capacitive sensing may also be used to detect if headphones are on a human head, or taken off etc. The capacitive sensing detection may also be induced to erroneously detect an "on-head" status when placed on or near a metal surface or object. Inductive sensing as disclosed herein can be used to provide information to prevent such problem events by determining the object is metallic or non-human tissue.

Figure 17:
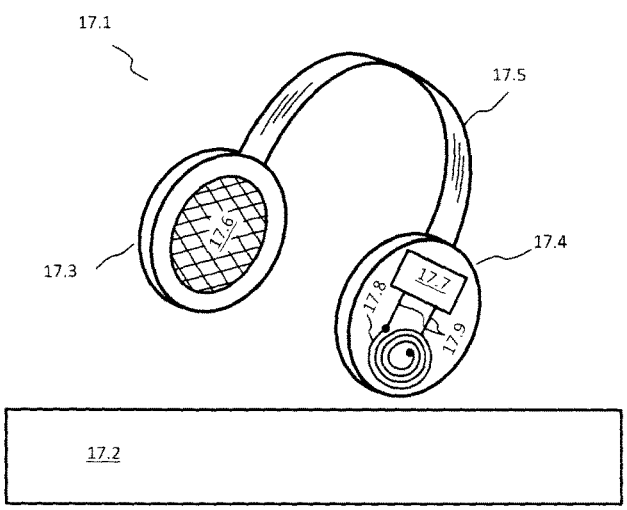
FIG. 17 shows an exemplary embodiment in the form of wireless headphones above a metal surface, wherein both inductance and capacitance measurements are performed with the same structure in order to identify the surface type.

The present invention may also be advantageously applied to wearable electronic devices in order to determine or identify characteristics of materials which come into proximity to said devices. FIG. 17 illustrates such an embodiment in exemplary manner at 17.1, where a pair of wireless headphones, as is known, is shown above a metal surface 17.2, for example a table top or counter. The exemplary headphones comprise two earpieces 17.3 and 17.4 and a headband 17.5. As is typical in such headphones, speakers may be located on the inner sides of the earpieces, and covered with the one or other soft material 17.6 for user comfort. As is known in the prior art, such headphones may make use of, for example, capacitive sensing to facilitate a user interface, wherein capacitive sensing electrodes are typically located on or underneath the outer surfaces of the earpieces, and proximity, touch and swipe gestures are used for audio playback control. However, one drawback of headphones with such a capacitive sensing user interface is the possibility for erroneous operation, due to the proximity of materials such as metal surface 17.2, which may cause the false annunciation of proximity and touch gestures. The present invention teaches that this drawback may be overcome with an embodiment as illustrated in exemplary manner in FIG. 17, wherein a coil structure 17.8 is used for both inductance and capacitance measurements, as disclosed earlier. Said coil structure is connected to an inductance measurement circuit 17.7 via interconnections 17.9, and said inductance measurement may be performed with a charge transfer method and circuitry as disclosed earlier. However, coil structure 17.8 may also be used for charge transfer based capacitance measurements with circuit 17.7, and wherein the capacitive sensing thus performed may be used to implement a proximity or touch based user interface as held by the prior art. According to the present invention, said inductance measurements may be used for example to verify that material in proximity to the headphones does not have a metal content which may cause the false detection and annunciation of proximity or touch events by the capacitive sensing circuitry. For example, in the embodiment illustrated, metal surface 17.2 may cause circuitry 17.7 to detect a touch event when performing capacitive sensing measurements with structure 17.8 as electrode. However, because circuitry 17.7 embodies the present invention, it may also measure the inductance of structure 17.8 before, during or after said capacitive sensing measurements. From the inductance measurement, the proximity of metal surface 17.2 may be determined, and used to negate, translate or otherwise modify the capacitive sensing results obtained. In the preceding, the present invention is not limited to the use of a charge transfer based method and circuitry for capacitance and inductance measurements, but may use any of the capacitive sensing methods held by the prior art, with adjustment and modification as required, for measuring both capacitance and inductance.

Figure 18:
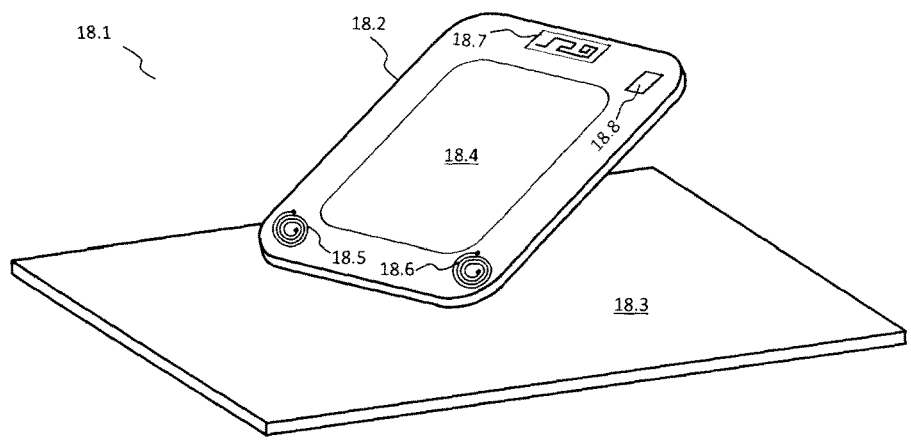
FIG. 18 shows an exemplary embodiment in the form of a tablet computer which utilizes the same structure to measure inductance, capacitance and transmit and receive RF, and which are in close proximity to a metal surface.

Using the same structures and circuitry to measure both capacitance and inductance, as taught by the present invention, may also be advantageously used in SAR protection applications with tablet computers, mobile phones and so forth. FIG. 18 illustrates an exemplary embodiment at 18.1, where a tablet computer 18.2 is located above a metal surface 18.3. Tablet computer 18.2 may typically comprise a large touchscreen 18.4 and an RF antenna or antennas 18.7. As is well known, such tablet computers, and other mobile electronic devices, may transmit substantial amounts of RF power. To prevent users from being subjected to RF-radiation above SAR limits, the prior art holds solutions where capacitive sensing is used to identify when human body tissue is in close proximity to the transmitting antenna or antennas, where after the amount of RF power being transmitted may be reduced until the presence of said tissue is not detected any more. However, one drawback of such solutions is that metal surfaces such as 18.3 may cause the capacitive sensing circuitry to falsely annunciate proximity of human body tissue, with RF transmission power then unnecessarily reduced. According to the present invention, this may be overcome by using the same sensing structures and circuitry to measure both capacitance and inductance, for example based on charge transfer measurements as disclosed. For example, in FIG. 18, two exemplary sensing structures 18.5 and 18.6 are located at the bottom corners of tablet 18.2, typically where the user would grip the device. Said sensing structures need not be constrained to two in number. Sensing structures 18.5 and 18.6 are drawn in the form of coils, but may take any form required, and are connected to an IC 18.8 via interconnections (not shown). In a first instance, sensing structures 18.5 and 18.6 may e.g. be used as electrodes for capacitive sensing measurements with IC 18.8, similar to what is known in the art of SAR protection applications, wherein certain proximity and/or touch parameters and/or events, or the lack thereof, are required before RF-transmission is allowed at certain levels. However, in a second instance, according to the present invention, the same sensing structures 18.5 and 18.6 may e.g. be used as coils or inductors for inductance measurements with IC 18.8, which may be used to verify that it is indeed human tissue which in proximity to the tablet or RF antennas. Is should be noted that the positioning of sensing structures 18.5 and 18.6 and of RF antenna 18.7 is purely for clarity of illustration's sake, and should not be interpreted as limiting or even optimal. For example, sensing structures used in SAR protection applications are often placed in close proximity to the RF-antenna or antennas, or they are one and the same. In the example shown, inductance measurements with sensing structures 18.5 and 18.6 may identify the close proximity of metal surface 18.3, and assist circuit 18.8, or another circuit, to determine that it is not human tissue which caused detection of a capacitive sensing proximity or touch event. This may then for example be used to decide whether to increase RF-transmission power or not.

It is to be understood that a large number of variations of the embodiment depicted in FIG. 18 is possible which may still fall within the spirit, scope and claims of the present invention. For example, the structures used as inductive coils and capacitive sensing electrodes need not be the same, but may be separate or distinct structures. Similarly, different circuits may be used for inductance and capacitance measurements as discussed. Or capacitive sensing electrode structures may be used with an IC for capacitance measurements, wherein inductive coil structures are realised within the IC packaging, and used for inductance measurements as discussed. Or, for example, antenna 18.7 may be designed such that it may be used for inductance measurements as disclosed, capacitive sensing measurements as disclosed and as RF transmit and receive antenna. Lastly, the present invention should not be limited to charge transfer based measurements of inductance and capacitance, but may be based on any of the prior art capacitive sensing measurement methods and technologies, as discussed earlier.

Figure 19:
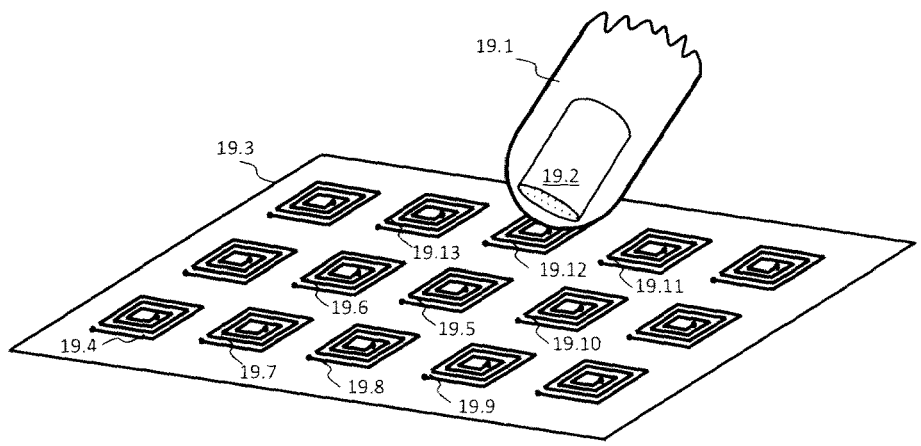
FIG. 19 shows an exemplary embodiment for the tracking the movement of a stylus with an array of coils.

In FIG. 19, another exemplary embodiment of the present invention is illustrated, wherein a matrix or array of coils or inductances 19.4 is located on a substrate 19.3, for example a PCB, and a passive stylus 19.1 engages said array of coils. According to the present invention, said coils may be used for mutual inductance measurements by a circuit, for example an IC (not shown) which comprise charge transfer measurement circuitry as disclosed earlier. Naturally, the present invention need not be limited to mutual inductance measurements, and self-inductance measurements may also be done for said array. In the example shown in FIG. 19, each of coils 19.5-19.13 may be utilized in turn as a transmitter coil, with the remaining coils in the array used as receiver coils, with the mutual inductance or coupling measured for each transmitter and receiver coil pair. In a preferred embodiment, the mutual inductance is only measured for receiver coils in close proximity to the transmitter coil. For example, if 19.5 are utilized as a transmitter inductor, only the coupling or mutual inductance with coils 19.6-19.13 may be measured, using methods and circuitry as disclosed earlier.

According to present invention, an apparatus and method as described above may be used to monitor the position and movement of an object which engages said array, for example stylus 19.1. In a preferred embodiment, stylus 19.1 contains a member 19.2 in its tip, as shown, wherein said member is fashioned out of either a material with high relative magnetic permeability, or out of metal which cause eddy current losses at the frequencies used for inductance measurement. If member 19.2 is made out is made out high relative magnetic permeability material, for example ferrite, it may increase coupling between transmitter and receiver coil pairs in proximity to said stylus. By sequentially utilizing each coil in said array as a transmitter coil, and monitoring the coupling with each receiver coil, the location of said stylus may be determined as an area with either increase mutual inductance, or decreased, depending on whether member 19.2 consists of high relative magnetic permeability material or a metal which cause eddy current losses. The pattern by which coils are utilized as transmitter coils need not be sequential, but may make use of any known pattern. For example, a random number may be used to decide which coil in the array to use next as a transmitter coil. Or a pattern may start by focussing on the periphery of the array, and once an area is identified with higher or lower mutual inductance, the pattern may focus only on that area.

Figure 20:
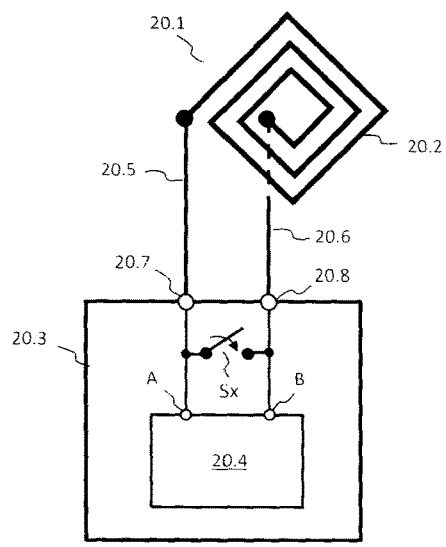
FIG. 20 shows an exemplary embodiment where a diamond shaped spiral structure is used for either inductance measurements or for capacitance measurements.

As mentioned during the summary of the invention, prior art capacitive sensing electrode arrays often make use of diamond shape electrodes, either solid or hollow. FIG. 20 shows an exemplary embodiment of the present invention which is a variation on prior art diamond shape electrodes. A diamond shaped electrode structure 20.1 consists of a conductor 20.2 formed into a spiral or coil. Conductor 20.2 may be fashioned out of copper on a PCB substrate, or from ITO on a transparent substrate such as glass, to give but two examples. According to the present invention, such an electrode structure, or another, may be used for both inductance and capacitive sensing. For inductance sensing, the present invention teaches that the two ends of the spiral or coil may be connected to a measurement circuit, for example a charge transfer circuit as disclosed. For capacitive sensing, said two ends of the spiral or coil may be shorted together, with the resulting common node which may be connected to a measurement circuit. For example, interconnections 20.5 and 20.6 may be used to connect the two ends of diamond spiral 20.1 to terminals 20.7 and 20.8 of IC 20.3, wherein the latter may comprise charge transfer based measurement circuitry 20.4, which may be used for inductance or capacitance measurements, as disclosed and known respectively. Naturally, the invention need not be limited to charge transfer based apparatus and methods only. Circuitry 20.4 may also control a switch Sx within said IC 20.3, wherein said switch is connected to terminals 20.7 and 20.8 as shown. According to the present invention, for inductance measurements, Sx may be open. Conversely, for capacitance measurements, Sx may be controlled by circuit 20.4, or another circuit, to be in a closed state. Table 1 below summarizes operation of a preferred, exemplary embodiment. Further, it should be noted that the present invention should not be limited to diamond shape spiral electrodes, as illustrated. Naturally, any electrode shape may embody the present invention where relevant, such as round spirals, single conductor lines, squares and so forth.

TABLE 1

| Measurement: | Sx: | Measure via: |
| --- | --- | --- |
| Inductance | Open | Terminals A & B |
| Capacitance | Closed | Terminal A or B |

Figure 21:
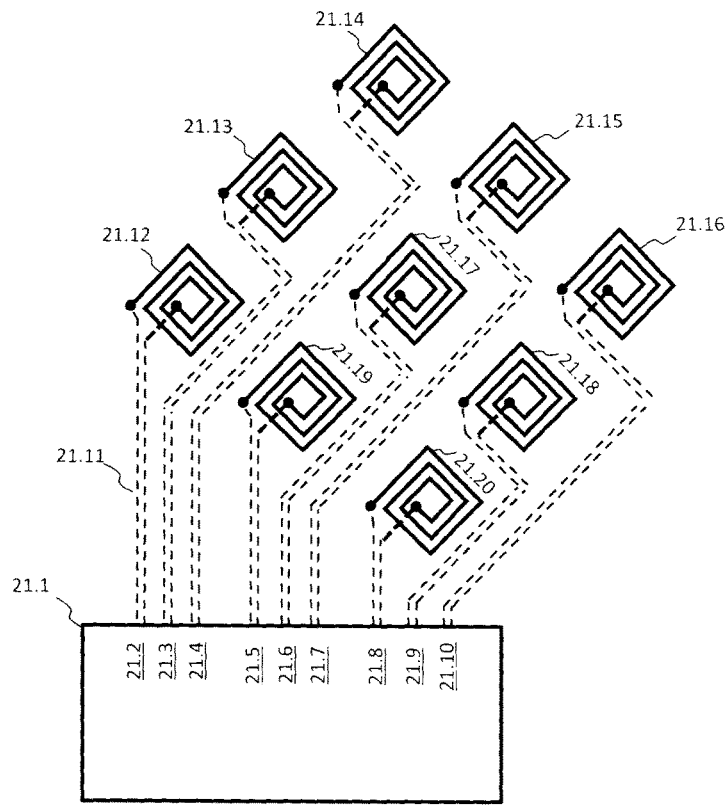
FIG. 21 shows an exemplary array of structures similar to that of FIG. 20 used for tracking a stylus with a magnetic member, or movement of a user's finger.

An array of diamond shaped spiral electrodes as in FIG. 20, or other electrodes, may be formed as illustrated in exemplary manner in FIG. 21, according to the present invention. As shown, each spiral diamond electrode 21.12-21.20 is connected by two lines, such as 21.11, to terminals 21.2-21.10 of an IC or discrete circuit 21.1. Said IC may comprise, for example, charge transfer measurement circuitry which may be used for the measurement of inductance and/or capacitance, as described for FIG. 20. In addition, each of terminals 21.2-21.10 may have a switch connected across them, to selectively short the ends of spiral diamond electrodes 21.12-21.20 out for capacitance measurements, as disclosed earlier. An array as shown in FIG. 21 may be used in a touch screen or touch pad application, for example, where either a user's finger is tracked with capacitive sensing, or a stylus with a ferrite tip is tracked with inductive sensing. For the latter, the disclosure with regards to FIG. 19 may also be applied.

Figure 22A:
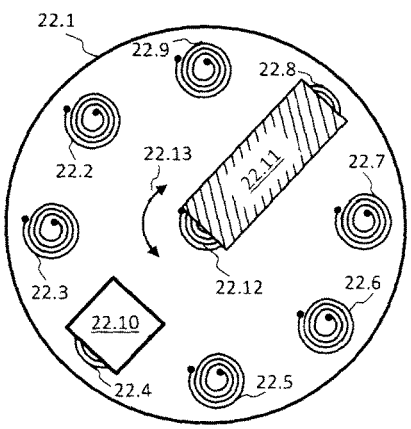
FIG. 22A shows an exemplary embodiment in the form of a dial switch which comprise both a metal member and a member with high relative magnetic permeability, to increase switch detection robustness.
Figure 22B:
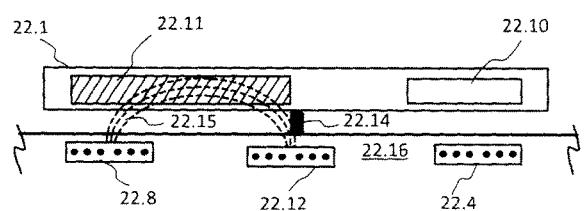
FIG. 22B shows a cross-sectional view of the embodiment depicted in FIG. 22A.

FIG. 22A and FIG. 22B shows another exemplary embodiment of the present invention, in the form of a dial switch, wherein FIG. 22A shows a top view, and FIG. 22B shows a side view. A number of coils or inductors 22.2-22.9 are arranged in a circular pattern around a central coil or inductor 22.12, wherein said coils or inductors may be realized on the one or other substrate, for example a PCB, and are located within a housing 22.16 of a product. Said housing may be a sealed housing, for example sealed against liquid or gas ingress or egress. A dial or knob 22.1 may be located external to said housing 22.16, and rotate in direction 22.13 about an axis or pivot point 22.14. A first member 22.11, fashioned out of a material with high relative magnetic permeability, for example out of ferrite, may be located within knob or dial 22.1, as shown. Further, a second member 22.10 may also be located with knob or dial 22.1, wherein the second member is out of the one or other metal, for example aluminium. As shown, said first and second members may be in a fixed relationship with one another, preferably being in line with one another. Thereby, when first member 22.11 is positioned over a first of the coils in said circular patterns, for example 22.8 as shown in FIG. 22B, the second member lies over a second one of the coils in said pattern, for example 22.4 as shown. Preferably, first member 22.11 may also be positioned within knob or dial 22.1 so that it always lies partially or completely over central coil 22.12, irrespective of the rotation of said knob or dial, according to the teachings of the present invention. Therefore, at a particular rotational position, said first member will enhance the coupling between a first coil in said pattern and the central coil, while said second member will degrade coupling between a second coil in the pattern and said central coil, due to eddy current losses in the metal of said second member. This may enable circuitry (not shown) connected to said coils to robustly detect the rotational position of the dial or knob, by sequentially, or in another manner, measuring the mutual inductance between each of the coils 22.2-22.9 in the circular pattern and the central coil 22.12, and by requiring that an increase in mutual inductance between a first coil and the central coil is matched by a decrease in mutual inductance between a second coil and the central coil. Preferably, the central coil may be a receiver coil, and the coils in said circular pattern may be transmitter coils. For example, as shown in FIG. 22B, when first member 22.11 is located such that it lies over first transmitter coil 22.8 and central receiver coil 22.12, the higher relative magnetic permeability of 22.11 may increase coupling of magnetic field lines 22.15 from transmitter coil 22.8 to receiver coil 22.12, which may result in an increase in the mutual inductance measured between 22.8 and 22.12. But for the same rotational position of dial 22.1, second member 22.10 out of, for example, aluminium lies over second transmitter coil 22.4. Due to eddy current losses in second member 22.10, the coupling between second transmitter coil 22.4 and central receiver coil 22.12 may be severely degraded, or even decreased to zero or close to zero, resulting in an associated significant decrease in the mutual inductance measured between coil 22.4 and 22.12. As such, according to the present invention, the rotational position of dial 22.1 may be robustly identified by looking for both said increase in measured mutual inductance, and said corresponding decrease. The present should also not be limited to the use of mutual inductance measurements, with regards to embodiments similar to that shown in FIG. 22A and FIG. 22B, but may also make use of self-inductance measurements. In such an embodiment, the central coil may be omitted, and inductance of each coil in the circular pattern may be measured sequentially, or according to another pattern.

To declare or annunciate a specific position of the dial or knob, it may be required for one coil to measure an increase in self-inductance and for a corresponding or associated coil a decrease may need to be measured.

The invention claimed is:

1. An integrated circuit for the measurement of a self-inductance of an inductive structure, said integrated circuit comprising an energy transfer measurement circuit that includes first and second controllable switches, at least one current mirror structure and an accumulation capacitor, wherein said inductive structure is connected via the first switch to an energy source during a first phase to facilitate current flow through the inductive structure, said first phase followed by a second phase during which the first switch is opened and the second switch is closed to allow uninterrupted current flow in said inductive structure, wherein current through said inductive structure also flows through an input of said current mirror structure during both the first and second phases, wherein the output of said current mirror structure is utilized to transfer energy to the accumulation capacitor during the second phase, and wherein said integrated circuit comprise means to register a count value for a number of repetitions of the first and second phases, and wherein said count value or a voltage on the accumulation capacitor is registered by the integrated circuit as a metric proportional to the value of said self-inductance.

2. The integrated circuit of claim 1, wherein said mutual-inductance measurements are used to sense rotation of a wheel consisting partially or wholly of metal.

3. The integrated circuit of claim 1 used in a double action switch comprising a dome-structure, wherein a metal member is attached to said dome-structure and changes the value of said mutual-inductance dependent on a state of said dome-structure, wherein said state changes between a first nominal state when no pressure is applied to the dome-structure, a second deformed state when a first amount of pressure is applied to the dome structure and a third snap-through state when a second amount of pressure which is more than said first amount of pressure is applied to the dome structure.

4. The integrated circuit of claim 1, wherein said energy transfer measurement circuit is additionally used for capacitance measurements, wherein said inductive structure, or another structure, is used as a capacitive sensing electrode during said capacitance measurements.

5. The integrated circuit of claim 4 used in a product, wherein mutual-inductance measurements are used to detect proximity of metal, and capacitance measurements are used to detect proximity of a user of said product.

6. The integrated circuit of claim 5, wherein said product contains a radio frequency (RF) transmitter, and wherein said mutual-inductance and capacitance measurements are used with Specific Absorption Rate (SAR) protection application circuitry to detect proximity of a user body and to determine when the level of RF transmission by said product should be reduced.

7. The integrated circuit of claim 6, wherein said SAR protection application circuitry is located within said integrated circuit.

8. The integrated circuit of claim 4, wherein said capacitance measurements are used to detect user proximity, wherein said proximity detection causes the integrated circuit to transition from a lower power to a higher power operating mode, wherein said mutual-inductance measurement is performed during the higher power mode.

9. The integrated circuit of claim 1 used with a tactile or dome switch of a product, wherein said product is located within a rigid, waterproof housing, wherein said tactile or dome switch cannot be depressed through said rigid housing, and wherein a movable metal plate is located external, but resiliently attached to said housing, wherein a user may depress said plate, with said integrated circuit detecting the resulting change in the measured mutual-inductance due to the movement of said plate, and wherein said integrated circuit may annunciate an activation or deactivation of said tactile or dome switch to said product if said change is securely detected.

10. An integrated circuit for the measurement of a mutual-inductance of an inductive structure comprising a transmitter inductor and a receiver inductor, said integrated circuit comprising an energy transfer measurement circuit that includes a wave generator, at least one current mirror structure and an accumulation capacitor, wherein said wave generator is used to energize said transmitter inductor, wherein a current flows through said receiver inductor due to said mutual-inductance and also through an input of said current mirror structure, wherein the output of said current mirror structure is utilized to transfer energy to the accumulation capacitor, and wherein said integrated circuit comprises means to register a count value for a number of repetitions of energy transfers to said accumulation capacitor, and wherein said count value or a voltage on the accumulation capacitor is registered by the integrated circuit as a metric proportional to the value of said mutual-inductance.

11. The integrated circuit of claim 10, said wave generator further comprising first and second controllable switches and an energy source, wherein said transmitter inductor is connected via the first switch to the energy source during a first phase to facilitate current flow through the transmitter, said first phase followed by a second phase during which the first switch is opened and the second switch is closed to allow uninterrupted current flow in said transmitter, wherein a current flows through said receiver inductor due to said mutual-inductance and also through an input of said current mirror structure during both the first and second phases, wherein the output of said mirror structure is utilized to transfer energy to the accumulation capacitor, and wherein said integrated circuit comprise means to register a count value for a number of repetitions of the first and second phases, and wherein said count value or a voltage on the accumulation capacitor is registered by the integrated circuit as a metric proportional to the value of said mutual-inductance.

12. The integrated circuit of claim 10, wherein said transmitter and receiver inductors are located within packaging of said integrated circuit.

13. The integrated circuit of claim 10, wherein a voltage source within the integrated circuit is in series with said receiver inductor, said voltage source having an amplitude minimally less than a forward biasing voltage required for an input diode of said current mirror structure, and wherein the polarity of the voltage source is such that it opposes the forward voltage of said diode.

14. The integrated circuit of claim 10, wherein said transmitter and receiver inductors are used to sense rotation of a wheel consisting partially or wholly of metal.

15. The integrated circuit of claim 10, wherein said energy transfer measurement circuit is additionally used for capacitance measurements, wherein said transmitter and receiver inductors, or other structures, are used respectively as transmitter and receiver capacitive sensing electrodes during said capacitance measurements.

16. The integrated circuit of claim 15 used in a product, wherein mutual-inductance measurements are used to detect proximity of metal, and capacitance measurements are used to detect proximity of a user of said product.

17. The integrated circuit of claim 16, wherein said product contains a radio frequency (RF) transmitter, and wherein said mutual-inductance and capacitance measurements are used with Specific Absorption Rate (SAR) protection application circuitry to detect proximity of a user body and to determine when the level of RF transmission by said product should be reduced.

18. The integrated circuit of claim 17, wherein said SAR protection application circuitry is located within said integrated circuit.

19. The integrated circuit of claim 15, wherein said capacitance measurements are used to detect user proximity, wherein said proximity detection causes the integrated circuit to transition from a lower power to a higher power operating mode, wherein said mutual-inductance measurement is performed during the higher power mode.

20. The integrated circuit of claim 10 utilized in a dial switch, wherein said switch comprises a number of transmitter inductors arranged in a circular pattern around a central receiver inductor, and a dial or knob located over said transmitter and receiver inductors, and wherein first and second coupling members are located within said dial or knob, wherein the first coupling member is fashioned out of a material with relatively high magnetic permeability and the second coupling member is fashioned out of a conductive material, wherein said first and second coupling members are arranged co-linear with each other and the central inductor, and wherein each of a number of predetermined positions of said dial switch are characterised by said first coupling member being located such that it increases coupling between a specific transmitter inductor and said receiver inductor, resulting in increased measured mutual-inductance, and by said second coupling member being located such that it decreases coupling between another inductor and said receiver inductor, resulting in reduced measured mutual-inductance, and wherein said integrated circuit requires both said increase and corresponding decrease in measured mutual-inductances before annunciating a position of said dial switch.

* * * * *

UNITED STATES PATENT AND TRADEMARK OFFICE
CERTIFICATE OF CORRECTION

PATENT NO. : 10,527,457 B2
APPLICATION NO. : 15/554181
DATED : January 7, 2020
INVENTOR(S) : Johannes Frederick Bruwer et al.

It is certified that error appears in the above-identified patent and that said Letters Patent is hereby corrected as shown below:

In the Claims

Column (38): Claim 2, Lines 11 and 12 delete "mutual-inductance" and insert --self-inductance--.

Column (38): Claim 3, Line 17 delete "mutual-inductance" and insert --self-inductance--.

Column (38): Claim 5, Line 31 delete "mutual-inductance" and insert --self-inductance--.

Column (38): Claim 6, Line 36 delete "mutual-inductance" and insert --self-inductance--.

Column (38): Claim 8, Line 48 delete "mutual-inductance" and insert --self-inductance--.

Column (38): Claim 9, Line 57 delete "mutual-inductance" and insert --self-inductance--.

Signed and Sealed this
Twenty-fourth Day of November, 2020

Andrei Iancu
*Director of the United States Patent and Trademark Office*